(12) United States Patent
Lu et al.

(10) Patent No.: US 11,469,168 B2
(45) Date of Patent: Oct. 11, 2022

(54) CAPACITOR AND METHOD FOR PRODUCING THE SAME

(71) Applicant: SHENZHEN GOODIX TECHNOLOGY CO., LTD., Shenzhen (CN)

(72) Inventors: Bin Lu, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/033,758

(22) Filed: Sep. 26, 2020

(65) Prior Publication Data

US 2021/0013143 A1    Jan. 14, 2021

Related U.S. Application Data

(63) Continuation of application No. PCT/CN2019/083533, filed on Apr. 19, 2019.

(51) Int. Cl.

| H01L 23/522 | (2006.01) |
| H01L 23/532 | (2006.01) |
| H01L 29/94  | (2006.01) |
| H01G 4/38   | (2006.01) |
| H01G 4/33   | (2006.01) |
| H01G 4/232  | (2006.01) |
| H01G 11/04  | (2013.01) |
| H01L 49/02  | (2006.01) |

(52) U.S. Cl.
CPC .......... *H01L 23/5223* (2013.01); *H01L 28/55* (2013.01); *H01L 28/75* (2013.01)

(58) Field of Classification Search
CPC ..... H01L 23/5223; H01L 28/55; H01L 28/75; H01L 27/10817
See application file for complete search history.

(56) References Cited

U.S. PATENT DOCUMENTS 5,903,024 A    5/1999  Hsu
9,111,689 B2   8/2015  Cho
(Continued)

FOREIGN PATENT DOCUMENTS

CN    102543430 A    7/2012
CN    102683318 A    9/2012
(Continued)

*Primary Examiner* — Omar F Mojaddedi

(57) ABSTRACT

A capacitor includes at least one multi-wing structure; a laminated structure, where the laminated structure clads the at least one multi-wing structure and includes at least one dielectric layer and a plurality of conductive layers, and the at least one dielectric layer and the plurality of conductive layers form a structure that a conductive layer and a dielectric layer are adjacent to each other; at least one first external electrode, where the first external electrode is electrically connected to some conductive layer(s) in the plurality of conductive layers; at least one second external electrode, wherein the second external electrode is electrically connected to the other conductive layer(s) in the plurality of conductive layers, and a conductive layer in the laminated structure adjacent to each conductive layer in the some conductive layer(s) includes at least one conductive layer in the other conductive layer(s).

16 Claims, 12 Drawing Sheets

(56) References Cited

U.S. PATENT DOCUMENTS

| | | |
|---|---|---|
| 10,153,095 B2 | 12/2018 | Zhou |
| 2004/0002187 A1* | 1/2004 | Block .................... H01L 28/87 |
| | | 257/E27.048 |
| 2010/0196592 A1 | 8/2010 | Kim et al. |
| 2011/0254132 A1 | 10/2011 | Cho |
| 2012/0126300 A1 | 5/2012 | Park et al. |
| 2014/0145304 A1 | 5/2014 | Lin et al. |
| 2015/0145101 A1* | 5/2015 | Hsu ........................ H01L 28/87 |
| | | 257/532 |
| 2015/0364611 A1* | 12/2015 | Funch ................... H01L 28/86 |
| | | 257/532 |
| 2017/0169958 A1* | 6/2017 | Zhou ..................... H01G 11/86 |
| 2017/0213884 A1* | 7/2017 | Balakrishnan .......... H01L 28/60 |
| 2019/0074141 A1 | 3/2019 | Zhou |

FOREIGN PATENT DOCUMENTS

| | | |
|---|---|---|
| CN | 102820279 A | 12/2012 |
| CN | 104520992 A | 4/2015 |
| CN | 106876152 A | 6/2017 |
| CN | 208738233 U | 4/2019 |
| EP | 0766313 A1 | 4/1997 |
| EP | 3182430 A1 | 6/2017 |

* cited by examiner

CAPACITOR AND METHOD FOR PRODUCING THE SAME

CROSS-REFERENCE TO RELATED APPLICATIONS

This disclosure is a continuation of International Application No. PCT/CN2019/083533, filed on Apr. 19, 2019, the disclosure of which is hereby incorporated by reference in its entirety.

TECHNICAL FIELD

The present disclosure relates to the field of capacitors, and in particular, to a capacitor and a method for producing the same.

BACKGROUND

A capacitor may play a role of bypassing, filtering, decoupling, or the like in a circuit, which is an indispensable part of ensuring a normal operation of the circuit. With the continuous development of modern electronic system towards multi-function, high integration, low power consumption and miniaturization, traditional multi-layer ceramic capacitors (MLCC) have been unable to meet the increasingly stringent requirements of small size and high capacity of applications. How to produce a capacitor with small volume and high capacity has become an urgent technical problem to be resolved.

SUMMARY

The disclosure provides a capacitor and a method for producing the same, and a capacitor with small volume and high capacitance density can be produced.

In a first aspect, a capacitor is provided, including:

at least one multi-wing structure;

a laminated structure, where the laminated structure clads the at least one multi-wing structure and includes at least one dielectric layer and a plurality of conductive layers, and the at least one dielectric layer and the plurality of conductive layers form a structure that a conductive layer and a dielectric layer are adjacent to each other;

at least one first external electrode, where the first external electrode is electrically connected to some conductive layer(s) in the plurality of conductive layers;

at least one second external electrode, where the second external electrode is electrically connected to the other conductive layer(s) in the plurality of conductive layers, and a conductive layer in the laminated structure adjacent to each conductive layer in the some conductive layer(s) includes at least one conductive layer in the other conductive layer(s).

In some possible implementation manners, the first external electrode is electrically connected to all odd-numbered conductive layer(s) in the plurality of conductive layers, and the second external electrode is electrically connected to all even-numbered conductive layer(s) in the plurality of conductive layers.

In some possible implementation manners, the plurality of conductive layers includes a first conductive layer, and the first conductive layer is complementary to the multi-wing structure in shape.

In some possible implementation manners, a conductive layer and a dielectric layer in the laminated structure other than the first conductive layer are conformal to the multi-wing structure.

In some possible implementation manners, the capacitor further includes a filling structure, and the filling structure clads the laminated structure to fill a gap formed by the laminated structure.

In some possible implementation manners, the filling structure is complementary to the laminated structure in shape.

In some possible implementation manners, the multi-wing structure is formed of a material with a resistivity less than a threshold value, or a surface of the multi-wing structure is provided with a heavily doped conductive layer with a resistivity less than a threshold value.

In some possible implementation manners, a conductive layer closest to the multi-wing structure in the laminated structure is electrically connected to the first external electrode, and the multi-wing structure is electrically connected to the second external electrode; or a conductive layer closest to the multi-wing structure in the laminated structure is electrically connected to the second external electrode, and the multi-wing structure is electrically connected to the first external electrode.

In some possible implementation manners, the multi-wing structure includes N axis (axes) and M wings, and the N axis (axes) extends along a first direction, and the M wings are convex structures formed by extending from a side wall(s) of the N axis (axes) towards a direction perpendicular to the first direction, M is an integer greater than or equal to 2, and N is a positive integer.

In some possible implementation manners, the M wings are formed of a first material, regions connecting the wings in the N axis (axes) are formed of the first material, and a region other than the regions connecting the wings in the N axis (axes) is formed of a second material different from the first material.

In some possible implementation manners, a first wing in the M wings and the N axis (axes) are formed of a third material, and a wing other than the first wing in the M wings is formed of a fourth material different from the third material.

In some possible implementation manners, the first wing is located above the remaining wing(s) of the M wings.

In some possible implementation manners, the capacitor further includes: a substrate disposed under the multi-wing structure.

In some possible implementation manners, the capacitor further includes:

an isolation ring located at an outer side of the at least one multi-wing structure, where the isolation ring is disposed in the laminated structure and extends from an upper surface of the laminated structure into or through the laminated structure along a first direction to isolate the laminated structure into a first region and a second region, and the first external electrode and/or the second external electrode is only electrically connected to the laminated structure located in the first region.

In some possible implementation manners, the multi-wing structure extends from an upper surface of the substrate into the substrate along a first direction.

In some possible implementation manners, the laminated structure extends from an upper surface of the substrate into the substrate along a first direction.

In some possible implementation manners, the substrate is a substrate with a resistivity less than a threshold value, the first external electrode is disposed under the substrate, and the second external electrode is disposed above the multi-wing structure.

In some possible implementation manners, the capacitor further includes: an electrode layer disposed above the multi-wing structure, the electrode layer includes at least one first conductive region and at least one second conductive region separated from each other, the first conductive region forms the first external electrode, and the second conductive region forms the second external electrode.

In some possible implementation manners, the first external electrode and/or the second external electrode is electrically connected to a conductive layer(s) in the plurality of conductive layers through an interconnection structure.

In some possible implementation manners, the interconnection structure includes at least one insulating layer and a conductive channel, and the conductive channel penetrates through the at least one insulating layer to electrically connect a conductive layer(s) in the plurality of conductive layers.

In some possible implementation manners, the conductive layer includes at least one of following layers:

a heavily doped polysilicon layer, a metal silicide layer, a carbon layer, a conductive polymer layer, an aluminum layer, a copper layer, a nickel layer, a tantalum nitride layer, a titanium nitride layer, an aluminum titanium nitride layer, a tantalum silicon nitride layer, or a tantalum carbon nitride layer.

In some possible implementation manners, the dielectric layer includes at least one of following layers:

a silicon oxide layer, a silicon nitride layer, a silicon oxynitride layer, a metal oxide layer, a metal nitride layer, or a metal oxynitride layer.

In a second aspect, a method for producing a capacitor is provided, including:

producing at least one multi-wing structure above a substrate;

producing a laminated structure on a surface of the at least one multi-wing structure, where the laminated structure clads the multi-wing structure and includes at least one dielectric layer and a plurality of conductive layers, and the at least one dielectric layer and the plurality of conductive layers form a structure that a conductive layer and a dielectric layer are adjacent to each other; and producing at least one first external electrode and at least one second external electrode, where the first external electrode is electrically connected to some conductive layer(s) in the plurality of conductive layers and the second external electrode is electrically connected to the other conductive layer(s) in the plurality of conductive layers, and a conductive layer in the laminated structure adjacent to each conductive layer in the some conductive layer(s) includes at least one conductive layer in the other conductive layer(s).

In some possible implementation manners, the first external electrode is electrically connected to all odd-numbered conductive layer(s) in the plurality of conductive layers, and the second external electrode is electrically connected to all even-numbered conductive layer(s) in the plurality of conductive layers.

In some possible implementation manners, the producing the at least one multi-wing structure above the substrate includes:

producing a multi-layer structure above a substrate, where the multi-layer structure includes at least two first material layers and at least one second material layer, and the at least two first material layers and the at least one second material layer form a structure that a first material layer and a second material layer are adjacent to each other, the first material layer is different from the second material layer, and the first material layer is in direct contact with the substrate;

producing at least one first trench on the multi-layer structure, where the first trench extends from an upper surface of the multi-layer structure into the multi-layer structure along a first direction; and removing some second material layer(s) exposed in the first trench to form the at least one multi-wing structure.

In some possible implementation manners, the producing the at least one multi-wing structure above the substrate includes:

producing a multi-layer structure above a substrate, where the multi-layer structure includes at least one fourth material layer and at least one fifth material layer, and the at least one fourth material layer and the at least one fifth material layer form a structure that a fourth material layer and a fifth material layer are adjacent to each other, the fourth material layer is different from the fifth material layer, and the fourth material layer is in direct contact with the substrate;

producing at least one first trench on the multi-layer structure, where the first trench extends from an upper surface of the multi-layer structure into the multi-layer structure along a first direction; and depositing a third material above the multi-layer structure and in the at least one first trench to form a first structure;

producing at least one second trench on the first structure, where the second trench extends from an upper surface of the first structure into the multi-layer structure along the first direction to expose the at least one fifth material layer, and the second trench is located at an outer side of the first trench; and removing the fifth material layer exposed in the second trench to form the at least one multi-wing structure.

In some possible implementation manners, the plurality of conductive layers includes a first conductive layer, and the first conductive layer is complementary to the multi-wing structure in shape.

In some possible implementation manners, a conductive layer and a dielectric layer in the laminated structure other than the first conductive layer are conformal to the multi-wing structure.

In some possible implementation manners, the method further includes:

producing a filling structure, where the filling structure clads the laminated structure to fill a gap formed by the laminated structure.

In some possible implementation manners, the filling structure is complementary to the laminated structure in shape.

In some possible implementation manners, the multi-wing structure is formed of a material with a resistivity less than a threshold value, or a surface of the multi-wing structure is provided with a heavily doped conductive layer with a resistivity less than a threshold value.

In some possible implementation manners, a conductive layer closest to the multi-wing structure in the laminated structure is electrically connected to the first external electrode, and the multi-wing structure is electrically connected to the second external electrode; or a conductive layer closest to the multi-wing structure in the laminated structure is electrically connected to the second external electrode, and the multi-wing structure is electrically connected to the first external electrode.

In some possible implementation manners, the multi-wing structure includes N axis (axes) and M wings, and the N axis (axes) extends along the first direction, and the M wings are convex structures formed by extending from a side wall(s)

of the axis (axes) towards a direction perpendicular to the first direction, M is an integer greater than or equal to 2, and N is a positive integer.

In some possible implementation manners, the method further includes:

producing an isolation ring, where the isolation ring is located at an outer side of the at least one multi-wing structure, and the isolation ring is disposed in the laminated structure and extends from an upper surface of the laminated structure into or through the laminated structure along a first direction to isolate the laminated structure into a first region and a second region, and the first external electrode and/or the second external electrode is only electrically connected to the laminated structure located in the first region.

In some possible implementation manners, the multi-wing structure extends from an upper surface of the substrate into the substrate along a first direction.

In some possible implementation manners, the laminated structure extends from an upper surface of the substrate into the substrate along a first direction.

In some possible implementation manners, the producing the at least one first external electrode and the at least one second external electrode includes:

producing an electrode layer above the laminated structure, where the electrode layer includes at least one first conductive region and at least one second conductive region separated from each other, the first conductive region forms the first external electrode, and the second conductive region forms the second external electrode.

In some possible implementation manners, the substrate is a substrate with a resistivity less than a threshold value; and the producing the at least one first external electrode and the at least one second external electrode includes:

producing the at least one first external electrode under the substrate, and producing the at least one second external electrode above the multi-wing structure.

In some possible implementation manners, the method further includes:

producing an interconnection structure, so that the first external electrode and/or the second external electrode is electrically connected to a conductive layer(s) in the plurality of conductive layers through the interconnection structure.

In some possible implementation manners, the interconnection structure includes at least one insulating layer and a conductive channel, and the conductive channel penetrates through the at least one insulating layer to electrically connect a conductive layer(s) in the plurality of conductive layers.

Therefore, in an embodiment of the present disclosure, a multi-wing structure is used as a framework, and a laminated structure is disposed on the multi-wing structure, so that a surface area of the laminated structure can be increased, and a larger capacitance value can be obtained under the condition of a smaller device size, thereby improving capacitance density of the capacitor formed by the laminated structure. Further, in the embodiment of the present disclosure, a laminated structure that a conductive layer and a dielectric layer are alternately stacked is adopted, so that the surface area of the laminated structure may be increased by making fuller use of the multi-wing structure as a framework, thereby further improving the capacitance density of the capacitor.

DESCRIPTION OF EMBODIMENTS

Technical solutions in embodiments of the present disclosure will be described hereinafter with reference to the accompanying drawings.

It should be understood that a capacitor of an embodiment of the present disclosure may play a role of bypassing, filtering, decoupling, or the like in a circuit.

The capacitor described in the embodiment of the present disclosure may be a 3D silicon capacitor which is a novel capacitor based on semiconductor wafer processing techniques. Compared with a traditional MLCC (multi-layer ceramic capacitor), the 3D silicon capacitor has advantages of small size, high precision, strong stability, and long lifetime. In a basic processing flow, a 3D structure with a high depth-to-width ratio such as a deep via, a trench, a pillar shape, a wall shape, or the like is required to be first processed on a wafer or substrate, and then an insulating film and a low-resistivity conductive material are deposited on a surface of the 3D structure to produce a lower electrode, an dielectric layer and an upper electrode of the capacitor, sequentially.

At present stage, based on a concept of multi-layer nesting in the manufacture of a DRAM, the 3D silicon capacitor is produced by alternately depositing a conductive material and an insulating material on a surface of a 3D structure to form a structure with a plurality of capacitors vertically stacked, then connecting all the capacitors in parallel by different connection manners on a front side of a silicon substrate to finally form a capacitor with a large capacitance value. However, at present, capacitance density of the wafer-level 3D capacitor is still limited.

In this context, the present disclosure proposes a novel capacitor structure and a method for producing the same, which may improve capacitance density of the capacitor.

Hereinafter, a capacitor according to an embodiment of the present disclosure will be introduced in detail with reference to FIGS. 1 to 14.

It should be understood that capacitors in FIGS. 1 to 14 are merely examples, and the number of multi-wing structures included in the capacitor is not limited to that included in the capacitors as shown in FIGS. 1 to 14, and may be determined according to actual needs. Meanwhile, the number of wings and the number of axes included in the multi-wing structure are only an example, and the number of wings and the number of axes included in the multi-wing structure are not limited to the capacitors shown in FIGS. 1 to 14, but may be flexibly set according to actual needs.

It should be noted that, to facilitate understanding, in embodiments shown below, for structures shown in different embodiments, the same structure is denoted by the same reference number, and a detailed explanation for the same structure is thus omitted for brevity.

Figure 1:
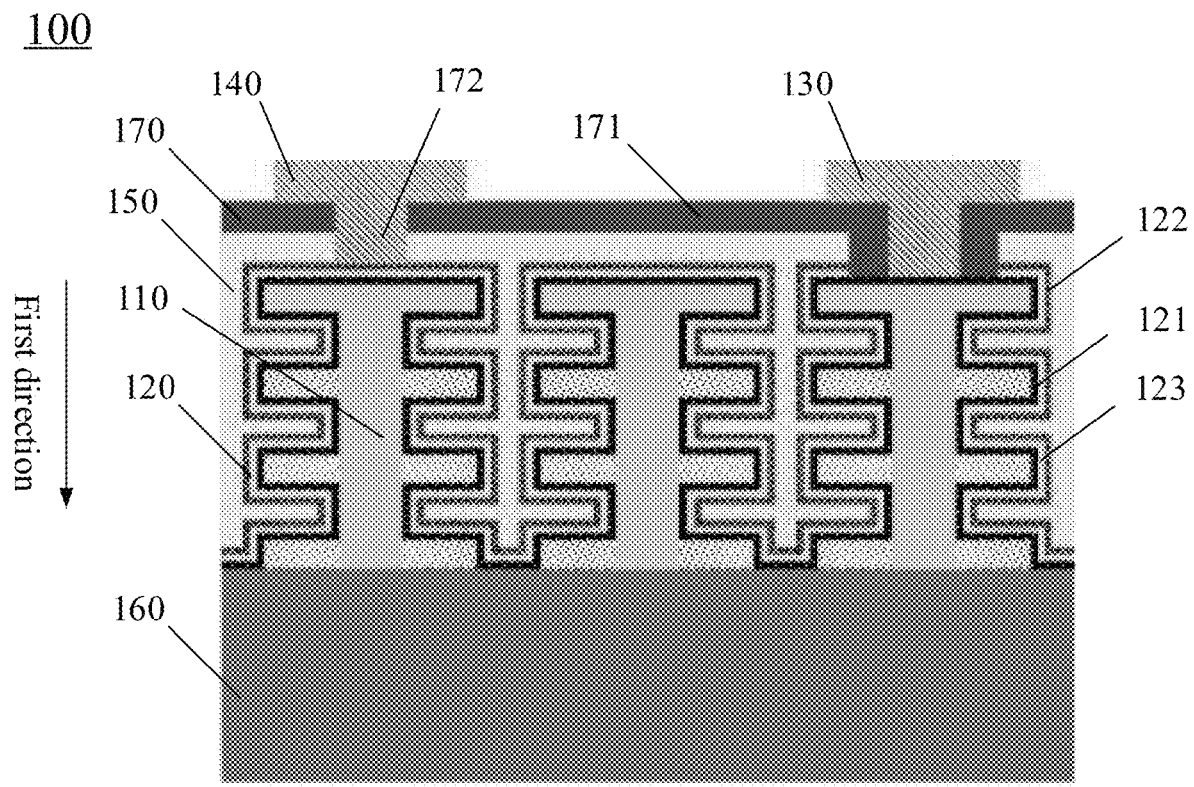
FIG. 1 is a schematic structural diagram of a capacitor according to an embodiment of the present disclosure.

FIG. 1 is a possible structural diagram of a capacitor 100 according to an embodiment of the present disclosure. As shown in FIG. 1, the capacitor 100 includes at least one multi-wing structure 110, a laminated structure 120, at least one first external electrode 130 and at least one second external electrode 140.

Specifically, as shown in FIG. 1, in the capacitor 100, the laminated structure 120 clads the multi-wing structure 110, and the laminated structure 120 includes at least one dielectric layer and a plurality of conductive layers, and the at least one dielectric layer and the plurality of conductive layers form a structure that a conductive layer and a dielectric layer are adjacent to each other; the first external electrode 130 is electrically connected to some conductive layer(s) in the plurality of conductive layers; and the second external electrode 140 is electrically connected to the other conductive layer(s) in the plurality of conductive layers, and a conductive layer in the laminated structure adjacent to each conductive layer in the some conductive layer(s) includes at least one conductive layer in the other conductive layer(s).

That is, in the embodiment of the present disclosure, two adjacent conductive layers in the plurality of conductive layers are electrically isolated by a dielectric layer. The specific number of the conductive layers and the dielectric layers may be flexibly configured according to actual needs, as long as electrical isolation between the two adjacent conductive layers in the plurality of conductive layers is satisfied.

It should be noted that, in an embodiment of the present disclosure, a multi-wing structure is used as a framework, and a laminated structure is disposed on the multi-wing structure, so that a surface area of the laminated structure may be increased, and a larger capacitance value may be obtained under the condition of a smaller device size, thereby improving capacitance density of the capacitor formed by the laminated structure. Further, in the embodiment of the present disclosure, a laminated structure that a conductive layer and a dielectric layer are alternately stacked is adopted, so that the surface area of the laminated structure may be increased by making fuller use of the multi-wing structure as a framework, thereby further improving the capacitance density of the capacitor.

In the embodiment of the present disclosure, the multi-wing structure 110 is a framework, that is, selection of a material of the multi-wing structure 110 may be more flexible, thereby simplifying a process of producing the multi-wing structure 110. For example, when a material of the multi-wing structure 110 is a conductive material, the multi-wing structure 110 may also be used as an electrode plate of the capacitor 100.

Optionally, in the embodiment of the present disclosure, the multi-wing structure 110 is formed of a material with a resistivity less than a threshold value, or a surface of the multi-wing structure 110 is provided with a heavily doped conductive layer with a resistivity less than the threshold value.

It should be noted that the multi-wing structure 110 is made of a material with a resistivity less than a threshold value, which may ensure that the multi-wing structure 110 is conductive, that is, it may be used as an electrode plate of the capacitor 100.

For example, a conductive layer closest to the multi-wing structure 110 in the laminated structure 120 is electrically connected to the first external electrode 130, and the multi-wing structure 110 is electrically connected to the second external electrode 140.

For another example, a conductive layer closest to the multi-wing structure 110 in the laminated structure 120 is electrically connected to the second external electrode 140, and the multi-wing structure 110 is electrically connected to the first external electrode 130.

Optionally, the first external electrode 130 or the second external electrode 140 may be electrically connected to some or all multi-wing structure(s) 110 in the at least one multi-wing structure 110.

Optionally, different multi-wing structures 110 may be electrically connected through a low-resistivity substrate, and different multi-wing structures 110 may also be electrically connected through a conductive sheet or a metal interconnection structure.

Optionally, the laminated structure 120 is conformal to the multi-wing structure 110. For example, as shown in FIG. 1, the laminated structure 120 may have the same or substantially the same outline as the multi-wing structure 110, so that the laminated structure 120 may clad a region of the multi-wing structure 110 in contact with the laminated structure 120, and thus the laminated structure 120 may obtain a larger surface area based on the multi-wing structure 110, thereby improving the capacitance density of the capacitor.

It should be understood that the external electrode in the embodiment of the present disclosure may also be referred to as a pad or an external pad.

Optionally, materials of the first external electrode 130 and the second external electrode 140 may be metal, such as copper, aluminum, or the like. The first external electrode 130 and the second external electrode 140 may also include low-resistivity Ti, TiN, Ta, TaN layers as an adhesion layer and/or a barrier layer; and they may also include some metal layers on surfaces of the external electrodes, such as Ni, Pd (palladium), Au, Sn (tin), Ag, which are used for a subsequent wire bonding or welding process.

Optionally, in the embodiment of the present disclosure, the conductive layer includes at least one of following layers:

a heavily doped polysilicon layer, a metal silicide layer, a carbon layer, a conductive polymer layer, an aluminum layer, a copper layer, a nickel layer, a tantalum nitride layer, a titanium nitride layer, an aluminum titanium nitride layer, a tantalum silicon nitride layer, or a tantalum carbon nitride layer.

That is, a material of the conductive layer in the laminated structure 120 may be heavily doped polysilicon, metal silicide, carbon, conductive polymer, metal such as Al, Cu, Ni, low-resistivity compounds such as tantalum nitride (TaN), titanium nitride (TiN), titanium aluminum nitride (TiAlN), tantalum silicon nitride (TaSiN), tantalum carbon nitride (TaCN), or the like, or a combination or a laminated structure of the foregoing materials. A specific conductive material and a layer thickness may be adjusted according to a capacitor capacitance, a frequency characteristic and a loss and other requirements of a capacitor. Of course, the conductive layer in the laminated structure 120 may also include some other conductive materials, which is not limited in the embodiment of the present disclosure.

Optionally, in the embodiment of the present disclosure, the dielectric layer includes at least one of following layers:

a silicon oxide layer, a silicon nitride layer, a silicon oxynitride layer, a metal oxide layer, a metal nitride layer, or a metal oxynitride layer.

That is, a material of the dielectric layer in the laminated structure 120 may be silicon oxide, silicon nitride, silicon oxynitride, metal oxide, metal nitride and metal oxynitride. For example, $SiO_2$, SiN, SiON, or a high dielectric constant (high-k) material including alumina, hafnium oxide, zirconium oxide, titanium oxide, $Y_2O_3$, $La_2O_3$, $HfSiO_4$, $LaAlO_3$, $SrTiO_3$, $LaLuO_3$, or the like. The dielectric layer in the laminated structure 120 may be one layer or include a plurality of laminated layers, and may be one material or a combination or mixture of a plurality of materials. A specific insulating material and a layer thickness may be adjusted according to a capacitance value, a frequency characteristic, a loss and other requirements of a capacitor. Of course, the dielectric layer in the laminated structure 120 may also include some other insulating materials, which is not limited in the embodiment of the present disclosure.

Optionally, in the embodiment of the present disclosure, the multi-wing structure 110 includes N axis (axes) and M wings, and the N axis (axes) extends along a first direction, and the M wings are convex structures formed by extending from a side wall(s) of the N axis (axes) towards a direction perpendicular to the first direction, M is an integer greater than or equal to 2, and N is a positive integer.

Figure 2:
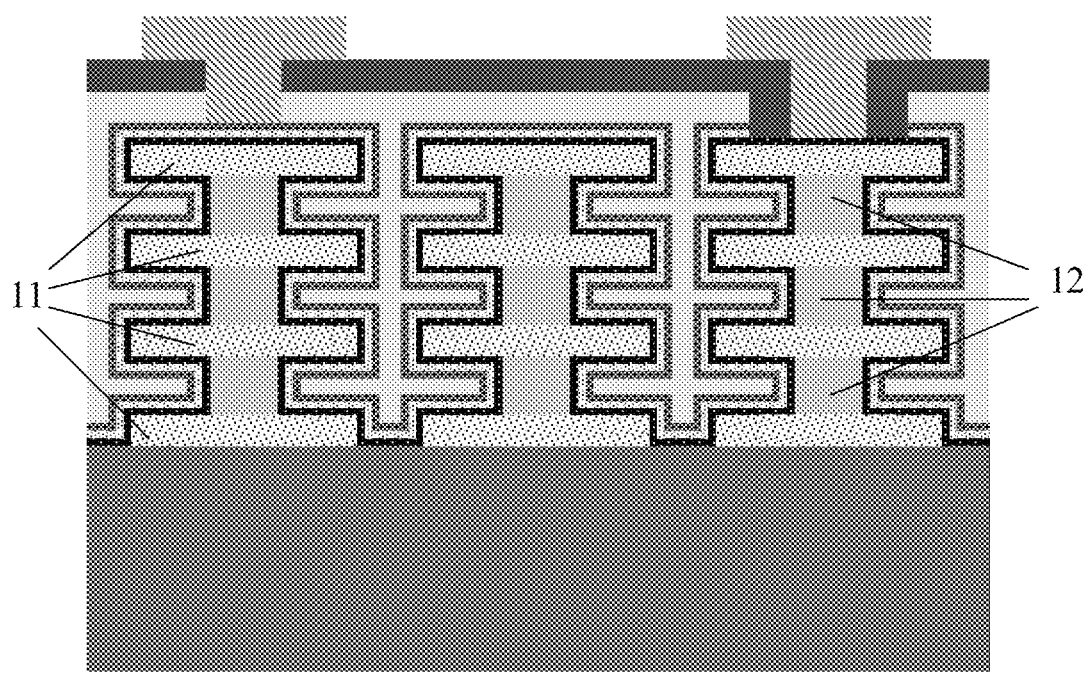
FIG. 2 is a schematic diagram of a material of a multi-wing structure according to an embodiment of the present disclosure.

Optionally, as shown in FIG. 2, the M wings are formed of a first material 11, regions connecting the wings in the N axis (axes) are formed of the first material 11, and a region other than the regions connecting the wings in the N axis (axes) is formed of a second material 12 different from the first material 11.

Optionally, the first material 11 or the second material 12 may be silicon (including monocrystalline silicon, polycrystalline silicon, amorphous silicon), silicon oxide, silicon nitride or silicon carbide, silicon-containing glass (including undoped silicon glass (USG), boro-silicate glass (BSG), phospho-silicate glass (PSG), boro-phospho-silicate glass (BPSG)), metals such as aluminum (Al), copper (Cu), nickel (Ni), or metal nitrides, metal carbides, carbon, organic polymers, or a combination or a laminated layer of the foregoing materials.

It should be understood that the second material 12 may be selectively removed relative to the first material 11. Specifically, in the same corrosion or etching environment, the difference in corrosion (or etching) rates of the first material 11 and the second material 12 is greater than 5 times.

For example, the first material 11 may be silicon, and the second material 12 may be silicon oxide, the silicon oxide may be removed by a hydrofluoric acid solution or gas, and the silicon may be retained.

For another example, the first material 11 may be silicon oxide, and the second material 12 may be silicon. With a KOH, or NaOH, or tetramethylammonium hydroxide (TMAH) solution, or xenon difluoride ($XeF_2$) gas, the silicon may be removed, and the silicon oxide may be retained.

For another example, the first material 11 may be silicon doped with concentrated boron, and the second material 12 may be silicon with low or no doping concentration. With a KOH, or NaOH, or TMAH solution, the silicon with low or no doping concentration may be quickly removed, and the silicon doped with concentrated boron may be retained.

Figure 3:
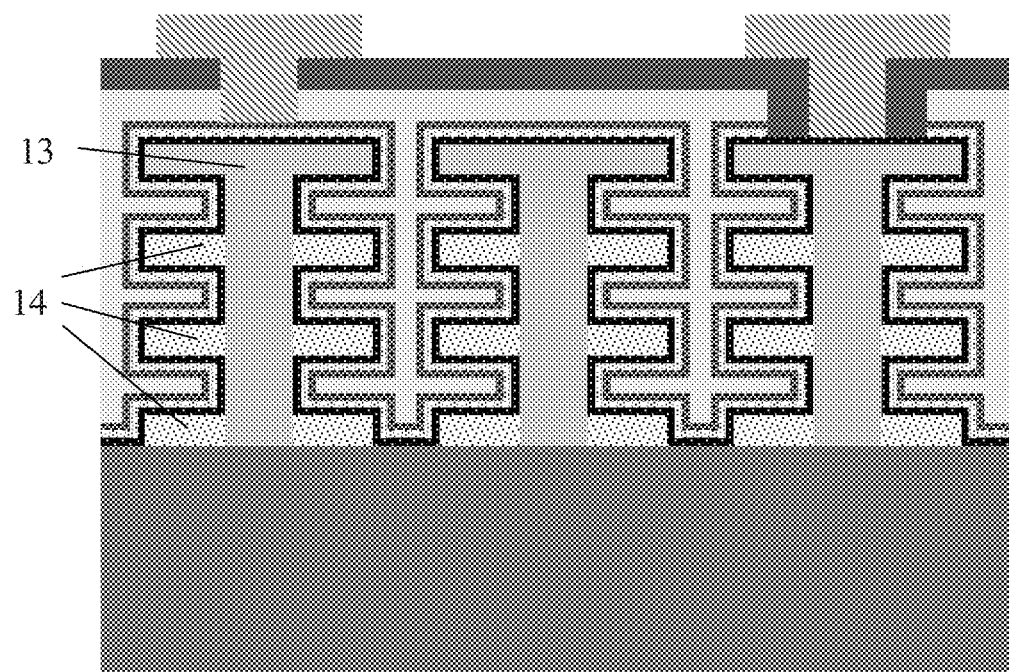
FIG. 3 is a schematic diagram of a material of another multi-wing structure according to an embodiment of the present disclosure.
Figure 4:
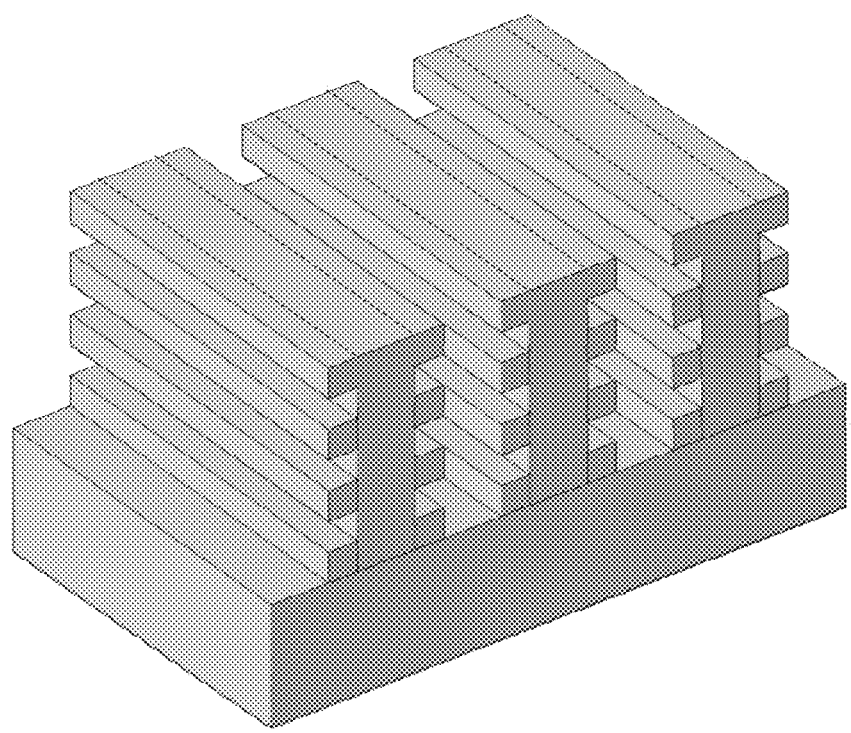
FIG. 4 is a schematic structural diagram of a multi-wing structure according to an embodiment of the present disclosure.
Figure 5:
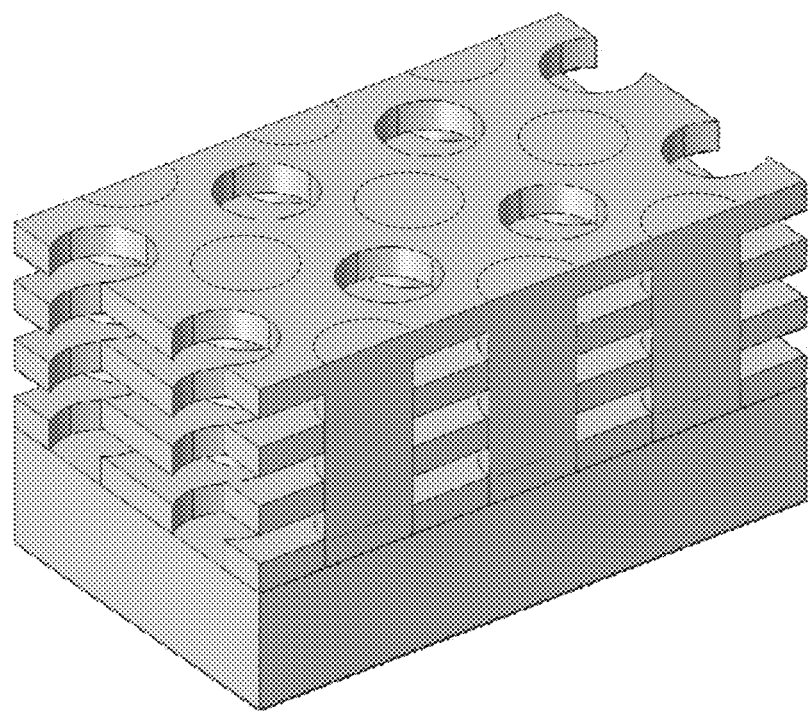
FIG. 5 is a schematic structural diagram of another multi-wing structure according to an embodiment of the present disclosure.
Figure 6:
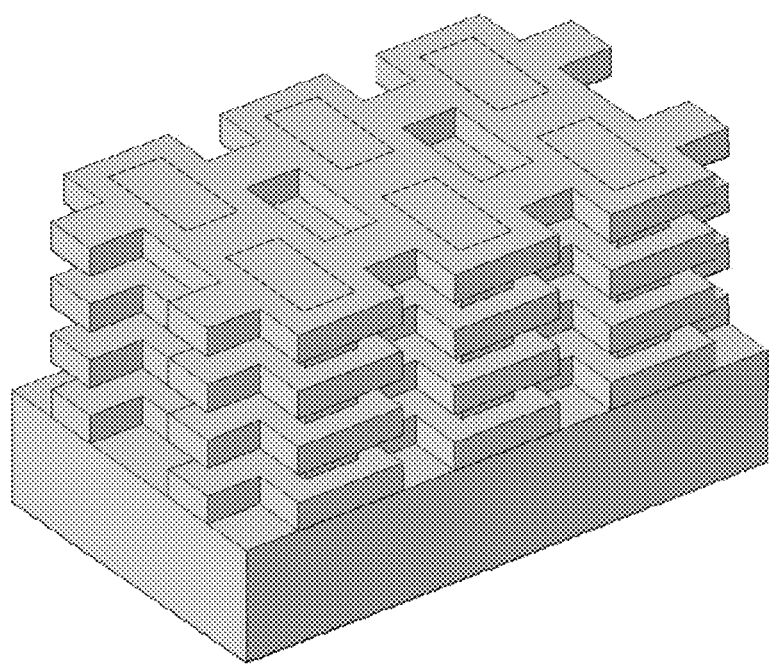
FIG. 6 is a schematic structural diagram of yet another multi-wing structure according to an embodiment of the present disclosure.

Optionally, as shown in FIG. 3, a first wing in the M wings and the N axis (axes) are formed of a third material 13, and a wing other than the first wing in the M wings is formed of a fourth material 14 different from the third material 13.

Optionally, the first wing is located above the remaining wing(s) of the M wings.

Optionally, the third material 13 or the fourth material 14 may be silicon (including monocrystalline silicon, polycrystalline silicon, amorphous silicon), silicon oxide, silicon nitride or silicon carbide, silicon-containing glass (including USG, BSG, PSG, BPSG), metals such as aluminum (Al), copper (Cu), nickel (Ni), or metal nitrides, metal carbides, carbon, organic polymers, or a combination or a laminated layer of the foregoing materials.

Optionally, the third material 13 and the fourth material 14 may also be the same.

In an embodiment of the present disclosure, specific values of M and N may be flexibly configured according to actual needs.

It is assumed that M=4 and N=1, as shown in FIG. 1, the multi-wing structure 110 may include four wings and one axis. It should be noted that M=4 and N=1 are just examples; and in the embodiment of the present disclosure, M may be an integer greater than or equal to 2, such as 5, 10 etc., and N may be an integer greater than or equal to 2, such as N=3, 4, etc., which is not limited in the embodiment of the present disclosure.

Optionally, in the embodiment of the present disclosure, the multi-wing structure 110 may be of various structures. For example, in the multi-wing structure 110 shown in FIG. 4, M=4 and N=1. For another example, in the multi-wing structure 110 shown in FIGS. 5 and 6, M=4 and N=3.

Optionally, in an embodiment of the present disclosure, as shown in FIG. 1, the capacitor 100 further includes a filling structure 150, and the filling structure 150 clads the laminated structure 120 to fill a cavity or gap formed by the laminated structure 120.

Optionally, the filling structure 150 is complementary to the laminated structure 120 in shape. For example, as shown in FIG. 1, the filling structure 150 may be structurally complementary to the laminated structure 120, and a combination of the foregoing two may form a structure without a gap or cavity inside, thus improving structural integrity and mechanical stability of the capacitor.

It should be noted that a material of the filling structure may be a conductive material or some other materials.

Optionally, when the material of the filling structure 150 is a conductive material, the filling structure 150 may also be used as an electrode plate of the capacitor 100.

Figure 7:
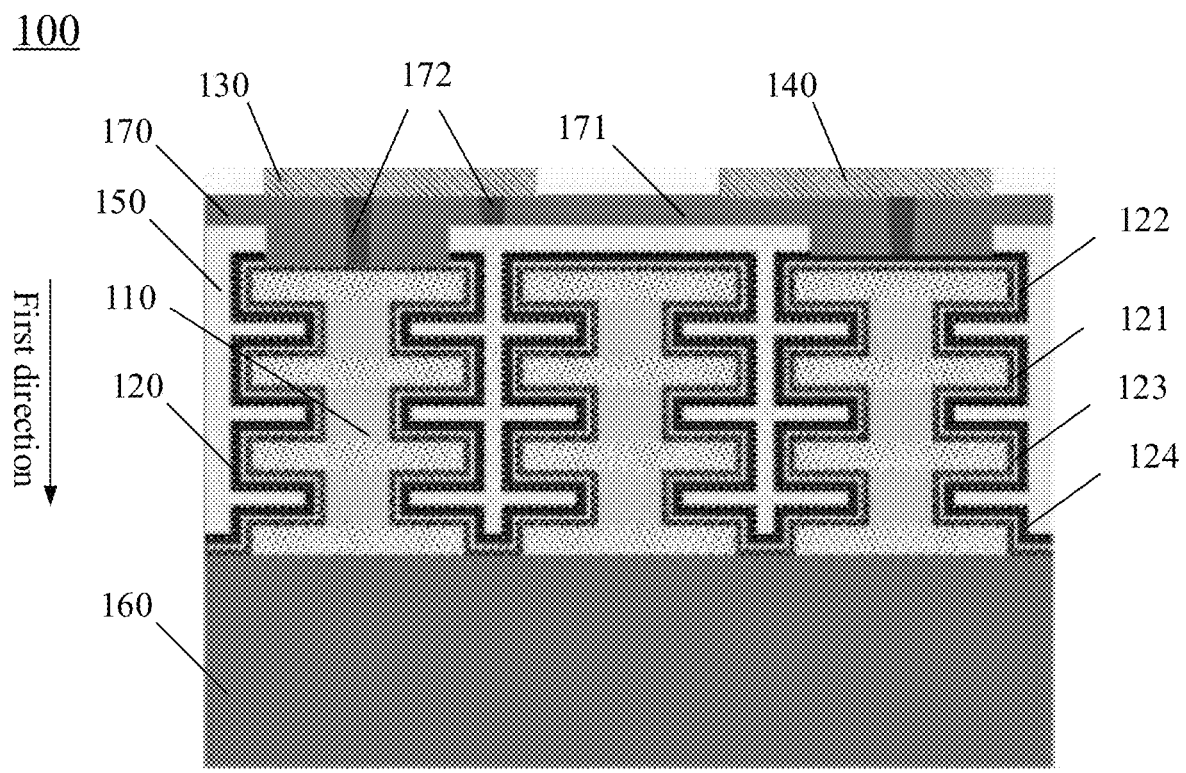
FIG. 7 is a schematic structural diagram of another capacitor according to an embodiment of the present disclosure.

For example, as shown in FIG. 7, it is assumed that the filling structure 150 is conductive, the laminated structure 120 includes two conductive layers and two dielectric layers, i.e., a conductive layer 121 and a conductive layer 122, and a dielectric layer 123 and a dielectric layer 124 shown in FIG. 7. Specifically, as shown in FIG. 7, the conductive layer 121 is in direct contact with the multi-wing structure 110, that is, the conductive layer 121 is disposed on a surface of the multi-wing structure 110 and clads the multi-wing structure 110; the conductive layer 122 is disposed above the conductive layer 121; the dielectric layer 123 is disposed between the conductive layer 121 and the conductive layer 122 to electrically isolate the conductive layers 121 and the conductive layer 122; and the dielectric layer 124 is disposed between the conductive layer 122 and the filling structure 150 to electrically isolate the conductive layer 122 from the filling structure 150. The first external electrode 130 is electrically connected to the conductive layer 121 and the filling structure 150, and the second external electrode 140 is electrically connected to the conductive layer 122.

It should be noted that in the laminated structure, an order of the at least one dielectric layer may be on the multi-wing structure, an ascending or descending order of a distance from the multi-wing structure. In the same way, an order of the plurality of conductive layers may also be on the multi-wing structure, an ascending or descending order of a distance from the multi-wing structure. For ease of description, in an embodiment of the present disclosure, the order of the at least one dielectric layer and the plurality of conductive layers is illustrated by taking an ascending order of a distance from the multi-wing structure on the multi-wing structure as an example.

It should be noted that, in the embodiment of the present disclosure, the first external electrode 130 is electrically connected to some conductive layer(s) in the plurality of conductive layers, the second external electrode 140 is electrically connected to the other conductive layer(s) in the plurality of conductive layers, and a conductive layer in the laminated structure 120 adjacent to each conductive layer in the some conductive layer(s) includes at least one conductive layer in the other conductive layer(s), for different first external electrodes 130 and second external electrodes 140, the laminated structure 120 may form capacitors with different capacitance values.

As an example, it is assumed that the capacitor 100 includes two first external electrodes and two second external electrodes, the two first external electrodes are respectively denoted as a first external electrode A and a first external electrode B, and the two second external electrodes are respectively denoted as a second external electrode C and a second external electrode D, and the laminated structure includes five conductive layers and four dielectric layers, and the five conductive layers are respectively denoted as a conductive layer 1, a conductive layer 2, a conductive layer 3, a conductive layer 4 and a conductive layer 5, and the four dielectric layers are respectively denoted as a dielectric layer 1, a dielectric layer 2, a dielectric layer 3, and a dielectric layer 4.

If the first external electrode A is electrically connected to the conductive layer 1 and the conductive layer 3, the first external electrode B is electrically connected to the conductive layer 1, the conductive layer 3 and the conductive layer 5, and the second external electrode C is electrically connected to the conductive layer 2 and the conductive layer 4, and the second external electrode D is also electrically connected to the conductive layer 2 and the conductive layer 4, for capacitors corresponding to the first external electrode A and the second external electrode C, the conductive layer 1 and the conductive layer 2 form a capacitor 1, and a capacitance value thereof is denoted as C1, the conductive layer 2 and the conductive layer 3 form a capacitor 2, and a capacitance value thereof is denoted as C2, the conductive layer 3 and the conductive layer 4 form a capacitor 3, and a capacitance value thereof is denoted as C3, and the capacitor 1, the capacitor 2 and the capacitor 3 are connected in parallel, and a capacitance value of an equivalent capacitor i is denoted as Ci, and thus Ci=C1+C2+C3; and for capacitors corresponding to the first external electrode B and the second external electrode D, the conductive layer 1 and the conductive layer 2 form a capacitor 1, and a capacitance value thereof is denoted as C1, the conductive layer 2 and the conductive layer 3 form a capacitor 2, and a capacitance value thereof is denoted as C2, the conductive layer 3 and the conductive layer 4 form a capacitor 3, and a capacitance value thereof is denoted as C3, the conductive layer 4 and the conductive layer 5 form a capacitor 4, and a capacitance value thereof is denoted as C4, and the capacitor 1, the capacitor 2, the capacitor 3 and the capacitor 4 are connected in parallel, and a capacitance value of an equivalent capacitor j is denoted as Cj, and thus Cj=C1+C2+C3+C4. Of course, the capacitors corresponding to the first external electrode A and the second external electrode D may also form a similar series or parallel structure, and the capacitors corresponding to the first external electrode B and the second external electrode C may also form a similar series or parallel structure, which will not be repeatedly described in detail here. Therefore, the laminated structure 120 may form capacitors with different capacitance values.

If the first external electrode A is electrically connected to the conductive layer 1 and the conductive layer 5, the first external electrode B is electrically connected to the conductive layer 3 and the conductive layer 5, the second external electrode C is electrically connected to the conductive layer 2 and the conductive layer 4, and the second external electrode D is also electrically connected to the conductive layer 4, for capacitors corresponding to the first external electrode A and the second external electrode C, the conductive layer 1 and the conductive layer 2 form a capacitor 1, and a capacitance value thereof is denoted as C1, the conductive layer 2 and the conductive layer 4 form a capacitor 2, and a capacitance value thereof is denoted as C2, and the capacitor 1 and the capacitor 2 are connected in parallel, and a capacitance value of an equivalent capacitor i is denoted as Ci, and thus Ci=C1+C2; and for capacitors corresponding to the first external electrode B and the second external electrode D, the conductive layer 3 and the conductive layer 4 form a capacitor 3, and a capacitance value thereof is denoted as C3, the conductive layer 4 and the conductive layer 5 form a capacitor 4, and a capacitance value thereof is denoted as C4, and the capacitor 3 and the capacitor 4 are connected in parallel, and a capacitance value of an equivalent capacitor j is denoted as Cj, and thus Cj=C3+C4. Therefore, the laminated structure 120 may form capacitors with different capacitance values.

Optionally, each first external electrode 130 in the at least one first external electrode 130 is electrically connected to all odd-numbered conductive layer(s) in the plurality of conductive layer; and each second external electrode 140 in the at least one second external electrode 140 is electrically connected to all even-numbered conductive layer(s) in the plurality of conductive layers. Thus, an effect of increasing capacitance density of a capacitor through a laminated structure may be fully utilized.

As an example, it is assumed that the capacitor 100 includes two first external electrodes and two second external electrodes, the two first external electrodes are respectively denoted as a first external electrode A and a first external electrode B, and the two second external electrodes are respectively denoted as a second external electrode C and a second external electrode D, and the laminated structure includes five conductive layers and four dielectric layers, and the five conductive layers are respectively denoted as a conductive layer 1, a conductive layer 2, a conductive layer 3, a conductive layer 4 and a conductive layer 5, and the four dielectric layers are respectively denoted as a dielectric layer 1, a dielectric layer 2, a dielectric layer 3, and a dielectric layer 4.

If the first external electrode A is electrically connected to the conductive layer 1, the conductive layer 3 and the conductive layer 5, the first external electrode B is electrically connected to the conductive layer 1, the conductive layer 3 and the conductive layer 5, the second external electrode C is electrically connected to the conductive layer 2 and the conductive layer 4, and the second external electrode D is also electrically connected to the conductive layer 2 and the conductive layer 4, for capacitors corresponding to the first external electrode A and the second external electrode C, the conductive layer 1 and the conductive layer 2 form a capacitor 1, and a capacitance value thereof is denoted as C1, the conductive layer 2 and the conductive layer 3 form a capacitor 2, and a capacitance value thereof is denoted as C2, the conductive layer 3 and the conductive layer 4 form a capacitor 3, and a capacitance value thereof is denoted as C3, and the conductive layer 4 and the conductive layer 5 form a capacitor 4, and a capacitance value thereof is denoted as C4, and the capacitor 1, the capacitor 2, the capacitor 3 and the capacitor 4 are connected in parallel, and a capacitance value of an equivalent capacitor i is denoted as Ci, and thus $Ci=C1+C2+C3+C4$; and for capacitors corresponding to the first external electrode B and the second external electrode D, the conductive layer 1 and the conductive layer 2 form a capacitor 1, and a capacitance value thereof is denoted as C1, the conductive layer 2 and the conductive layer 3 form a capacitor 2, and a capacitance value thereof is denoted as C2, the conductive layer 3 and the conductive layer 4 form a capacitor 3, and a capacitance value thereof is denoted as C3, and the conductive layer 4 and the conductive layer 5 form a capacitor 4, and a capacitance value thereof is denoted as C4, and the capacitor 1, the capacitor 2, the capacitor 3 and the capacitor 4 are connected in parallel, and a capacitance value of an equivalent capacitor j is denoted as Cj, and thus $Cj=C1+C2+C3+C4$.

Optionally, in an embodiment of the present disclosure, the capacitor 100 further includes a substrate 160 disposed under the multi-wing structure 110.

In an embodiment of the present disclosure, the first direction may be a direction perpendicular to the substrate 160, for example, as shown in FIGS. 1, 2, 3 and 7.

Optionally, in the embodiment of the present disclosure, the substrate 160 may be a silicon wafer, including monocrystalline silicon, polycrystalline silicon and amorphous silicon. The substrate 160 may also be other semiconductor substrates, including a silicon-on-insulator (SOI) wafer and a III-V group compound semiconductor wafer such as silicon carbide (SiC), gallium nitride (GaN) and gallium arsenide (GaAs), or the like, or may be a glass substrate, or an organic polymer substrate, or a substrate with a surface containing an epitaxial layer, an oxide layer, and a doped layer.

It should be noted that in the embodiment of the present disclosure, a thickness of the substrate 160 may also be flexibly set according to actual needs. For example, when the substrate 160 is too thick to meet the requirements, the substrate 160 may be thinned, and the substrate 160 may even be completely removed.

It should be noted that the foregoing FIGS. 1, 2, 3 and 7 are cross-sections along a longitudinal direction of the substrate.

Optionally, in the embodiment of the present disclosure, the first external electrode 130 and/or the second external electrode 140 are electrically connected to a conductive layer(s) in the plurality of conductive layers through an interconnection structure 170.

Optionally, the interconnection structure 170 includes at least one insulating layer 171 and a conductive channel 172, and the conductive channel 172 penetrates through the at least one insulating layer 171 to electrically connect a conductive layer in the plurality of conductive layers. As shown in FIG. 1, the interconnection structure 170 is disposed above the filling structure 150.

It should be noted that the at least one insulating layer 171 may also be referred to as an intermetal dielectric (IMD) layer or an interlayer dielectric (ILD) layer.

Optionally, a material of the at least one first insulating layer 171 may be an organic polymer material, including polyimide, parylene, benzocyclobutene (BCB), etc., it may also be some inorganic materials, including spin on glass (SOG), undoped silicon glass (USG), boro-silicate glass (BSG), phospho-silicate glass (PSG), boro-phospho-silicate glass (BPSG), silicon oxide synthesized by tetraethyl orthosilicate (TEOS), silicon oxide, silicon nitride and ceramic; and it may also be a combination or laminated layer of the foregoing materials.

Optionally, a material of the conductive channel 172 may be a low-resistivity conductive material, such as heavily doped polysilicon, tungsten, Ti, TiN, Ta, or TaN.

It should be understood that a shape of the conductive channel 172 and the number thereof may be specifically determined according to a producing process of the capacitor 100, which is not limited in the embodiment of the present disclosure.

Optionally, in the embodiment of the present disclosure, it is assumed that the laminated structure 120 includes two conductive layers and one dielectric layer, i.e., a conductive layer 121, a conductive layer 122 and a dielectric layer 123 shown in FIG. 1. Specifically, as shown in FIG. 1, the conductive layer 121 is in direct contact with the multi-wing structure 110, that is, the conductive layer 121 is disposed on a surface of the multi-wing structure 110 and clads the multi-wing structure 110; the conductive layer 122 is disposed above the conductive layer 121; and the dielectric layer 123 is disposed between the conductive layer 121 and the conductive layer 122 to electrically isolate the conductive layer 121 and the conductive layer 122.

Optionally, in some embodiments, the at least one first external electrode 130 and the at least one second external electrode 140 are disposed above the multi-wing structure 110. Optionally, the capacitor 100 further includes an electrode layer disposed above the multi-wing structure 110, and the electrode layer includes at least one first conductive region and at least one second conductive region separated from each other, the first conductive region forms the first external electrode 130, and the second conductive region forms the second external electrode 140, as shown in FIG. 1. That is, the at least one first external electrode 130 and the at least one second external electrode 140 may be formed by one etching, which reduces the number of the etching steps.

Specifically, as shown in FIGS. 1 and 7, the electrode layer is disposed above the interconnection structure 170, the first external electrode 130 is electrically connected to the conductive layer 121 through the conductive channel 172, and the second external electrode 140 is electrically connected to the conductive layer 122 through the conductive channel 172.

Optionally, in some embodiments, the plurality of conductive layers includes a first conductive layer, and the first conductive layer is complementary to the multi-wing structure 110 in shape.

That is, the cavity or gap formed in the laminated structure 120 may be filled by a layer farthest from the multi-wing structure 110 in the plurality of conductive layer, so as to improve structural integrity and mechanical stability of the capacitor.

It should be noted that the arrangement of the first conductive layer may fill the cavity or gap formed in the laminated structure 120, and the arrangement of the first conductive layer may improve the structural integrity and mechanical stability of the capacitor.

Optionally, a conductive layer and a dielectric layer in the laminated structure 120 other than the first conductive layer 125 are conformal to the multi-wing structure 110.

Figure 8:
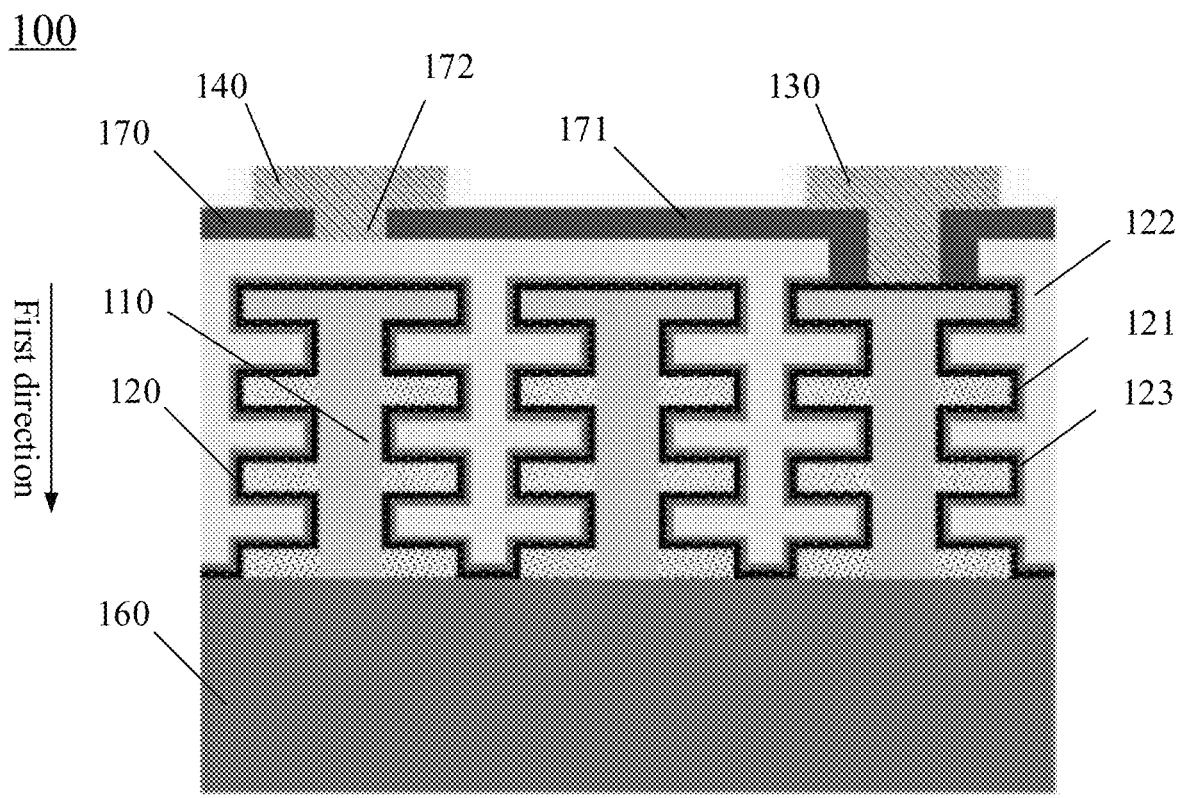
FIG. 8 is a schematic structural diagram of yet another capacitor according to an embodiment of the present disclosure.

Specifically, as shown in FIG. 8, the laminated structure includes a conductive layer 121, a conductive layer 122 and a dielectric layer 123, where the conductive layer 122 is a first conductive layer. The conductive layer 121 is in direct contact with the multi-wing structure 110, that is, the conductive layer 121 is disposed on a surface of the multi-wing structure 110 and clads the multi-wing structure 110; the dielectric layer 123 is disposed on an upper surface of the conductive layer 121; and the conductive layer 122 fills a cavity or gap formed by the conductive layer 121 and the dielectric layer 123 in the laminated structure 120, and the dielectric layer 123 is disposed between the conductive layer 121 and the conductive layer 122 to electrically isolate the conductive layer 121 from the conductive layer 122. The first external electrode 130 is electrically connected to the conductive layer 121, and the second external electrode 140 is electrically connected to the conductive layer 122.

It should be understood that, except that the arrangements of the laminated structure 120 and the filling structure 150 are different, the other arrangements in FIG. 8 and FIG. 1 are the same, which will not be repeatedly described for brevity.

Optionally, in some embodiments, the multi-wing structure 110 extends from an upper surface of the substrate 160 into the substrate 160 along a first direction.

Figure 9:
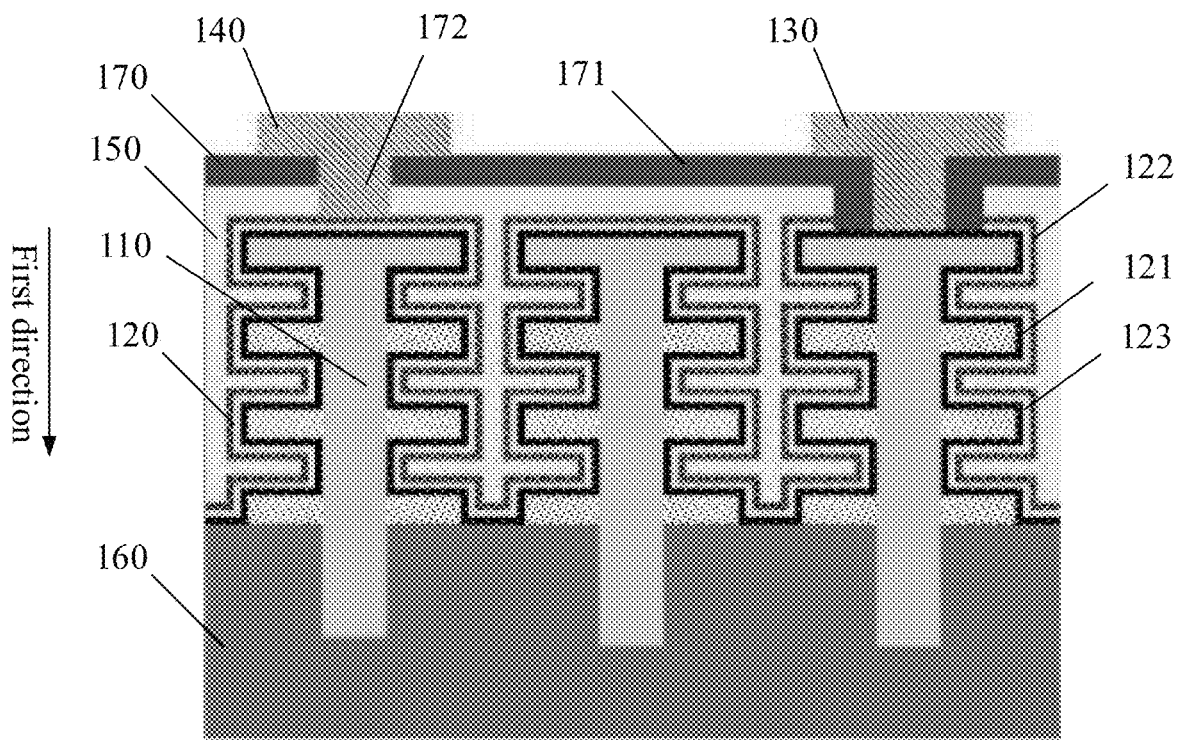
FIG. 9 is a schematic structural diagram of yet another capacitor according to an embodiment of the present disclosure.

For example, as shown in FIG. 9, the N axis (axes) in the multi-wing structure 110 extends from an upper surface of the substrate 160 into the substrate 160 along the first direction. Thus, mechanical stability of the multi-wing structure 110 may be improved.

It should be understood that, except that the arrangement of the multi-wing structure 110 is different, the other arrangements in FIG. 9 and FIG. 1 are the same, which will not be repeatedly described for brevity.

Optionally, in some embodiments, the laminated structure 120 extends from an upper surface of the substrate 160 into the substrate 160 along a first direction.

Figure 10:
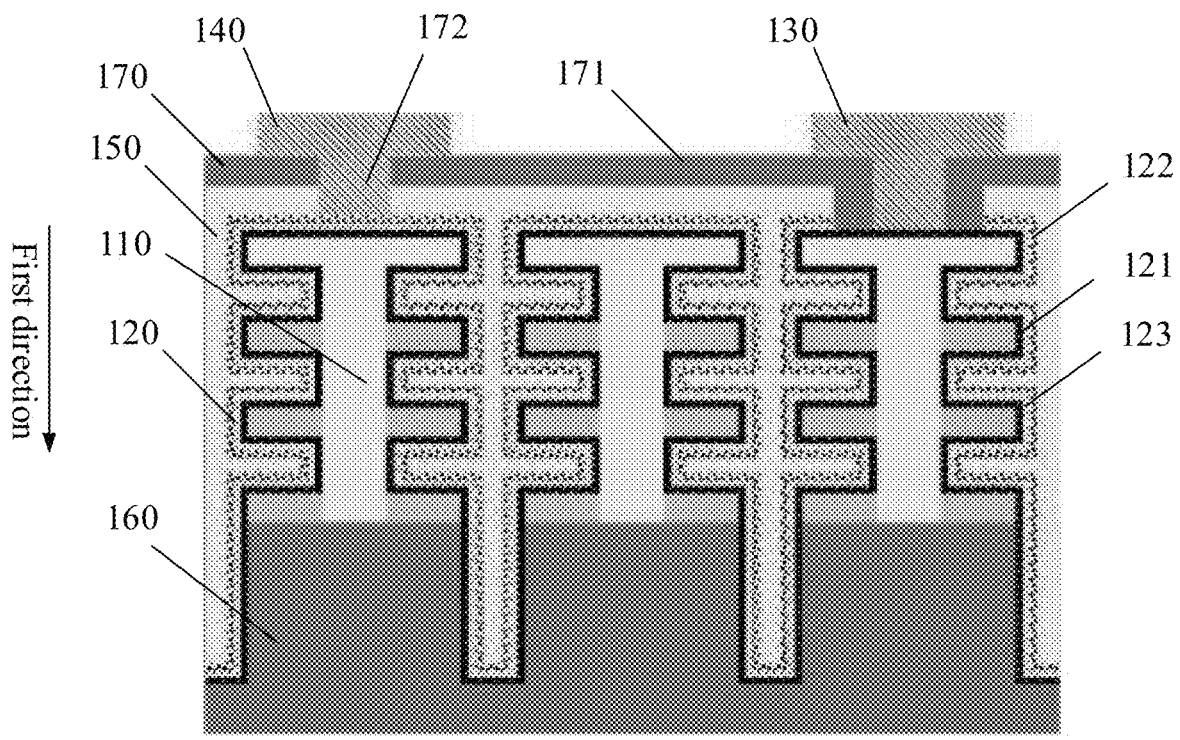
FIG. 10 is a schematic structural diagram of yet another capacitor according to an embodiment of the present disclosure.

For example, as shown in FIG. 10, the laminated structure 120 extends from an upper surface of the substrate 160 into the substrate 160 along a first direction, which may improve mechanical stability of the multi-wing structure 110. Further, a surface area of each conductive layer in the laminated structure 120 may also be increased, thereby increasing the capacitance density.

It should be noted that when the laminated structure 120 extends into the substrate 160, the filling structure 150 also extends into the substrate 160.

It should be understood that, except that the arrangement of the laminated structure 120 is different, the other arrangements in FIG. 10 and FIG. 1 are the same, which will not be repeatedly described for brevity.

Optionally, in an embodiment of the present disclosure, when the substrate 160 is a low-resistivity substrate, the first external electrode 130 is disposed under the substrate 160, and the second external electrode 140 is disposed above the multi-wing structure 110.

Figure 11:
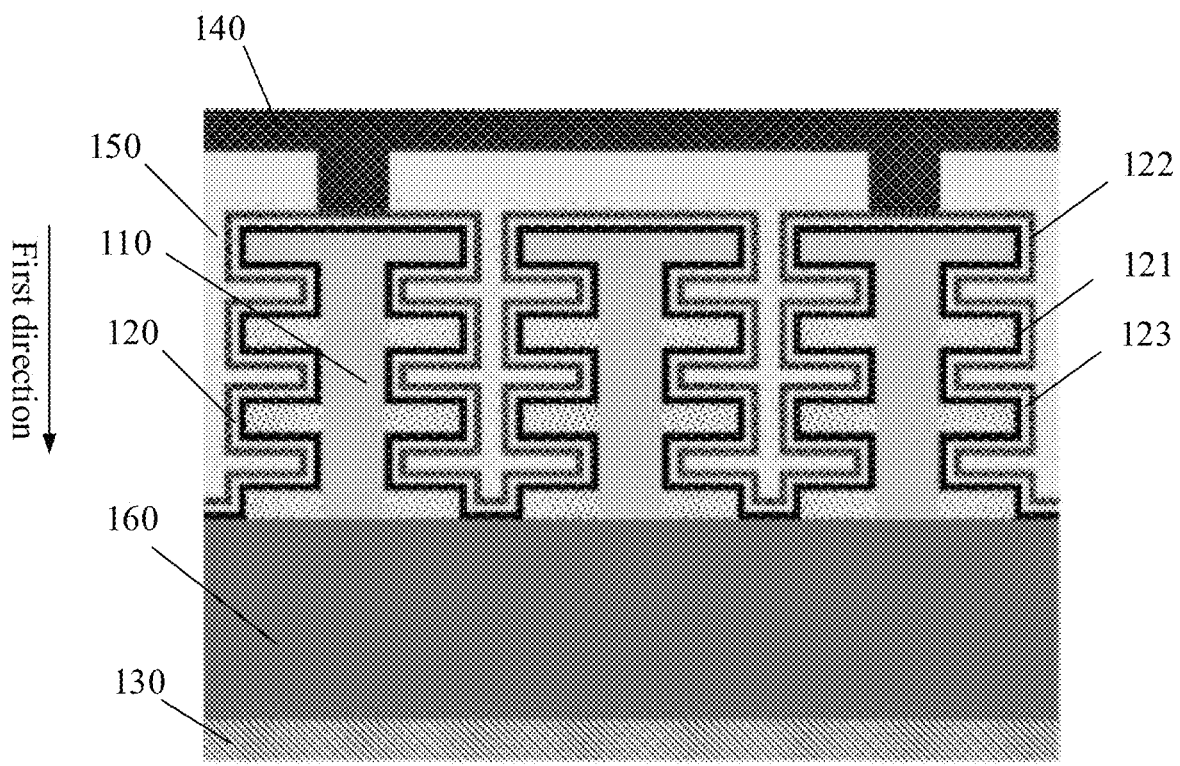
FIG. 11 is a schematic structural diagram of yet another capacitor according to an embodiment of the present disclosure.

For example, as shown in FIG. 11, a first external electrode 130 is disposed under a substrate 160 and a second external electrode 140 is disposed above a multi-wing structure 110; and the first external electrode 130 is electrically connected to a conductive layer 121 through the substrate 160, and the second external electrode 140 is electrically connected to a conductive layer 122 through an interconnection structure.

Figure 12:
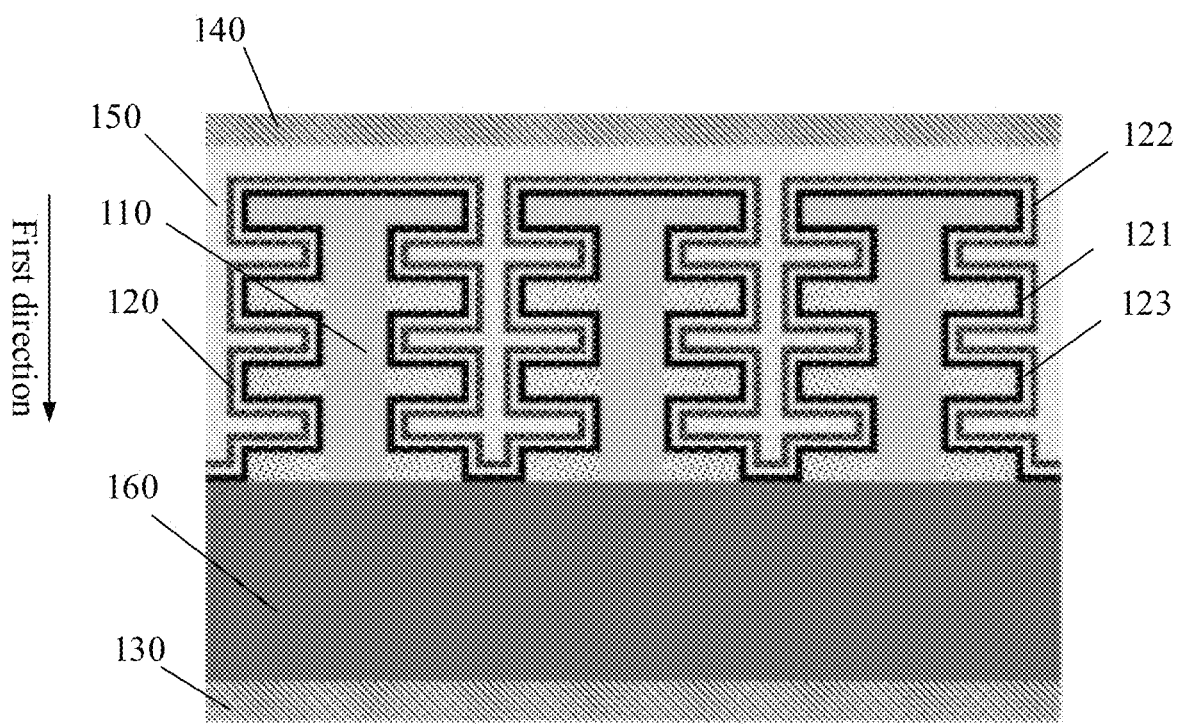
FIG. 12 is a schematic structural diagram of yet another capacitor according to an embodiment of the present disclosure.

For another example, as shown in FIG. 12, a first external electrode 130 is disposed under a substrate 160 and a second external electrode 140 is disposed above a multi-wing structure 110; and the first external electrode 130 is electrically connected to a conductive layer 121 through the substrate 160, and the second external electrode 140 is electrically connected to a conductive layer 122 through a conductive filling structure 150.

It should be noted that in the capacitor 100 shown in FIG. 1, FIG. 7, FIG. 8, FIG. 9 and FIG. 10, if the substrate 160 is a low-resistivity substrate, the following arrangement may also be achieved as shown in FIG. 11 or 12: the first external electrode 130 is disposed under the substrate 160, and the second external electrode 140 is disposed above the multi-wing structure 110, which will not be repeatedly described here.

Optionally, in the embodiment of the present disclosure, the capacitor 100 further include:

an isolation ring 180 located at an outer side of the at least one multi-wing structure 110, where the isolation ring 180 is disposed in the laminated structure 120 and extends from an upper surface of the laminated structure 120 into or through the laminated structure 120 along a first direction to isolate the laminated structure 120 into a first region 10 and a second region 20, and the first external electrode 130 and/or the second external electrode 140 is only electrically connected to the laminated structure 120 located in the first region 10.

Optionally, a material of the isolation ring 180 may be an organic polymer material, including polyimide, parylene, benzocyclobutene (BCB), etc., it may also be some inorganic materials, including SOG, USG, BSG, PSG, BPSG, silicon oxide synthesized by TEOS, silicon oxide, silicon nitride and ceramic; and it may also be a combination or a laminated layer of the foregoing materials.

Figure 13:
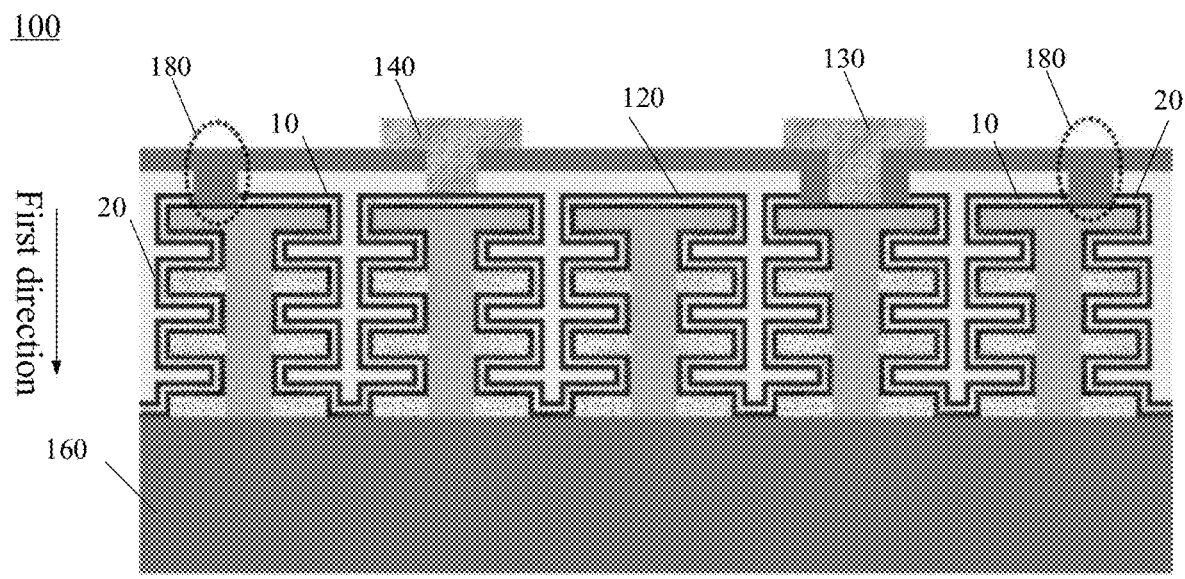
FIG. 13 is a schematic structural diagram of yet another capacitor according to an embodiment of the present disclosure.

For example, as shown in FIG. 13, the isolation ring 180 extends into the laminated structure 120 located at an edge of a capacitor chip along the first direction, thereby isolating the laminated structure 120 into a first region 10 and a second region 20, and the second external electrode 140 is only electrically connected to the laminated structure 120 located in the first region 10.

Figure 14:
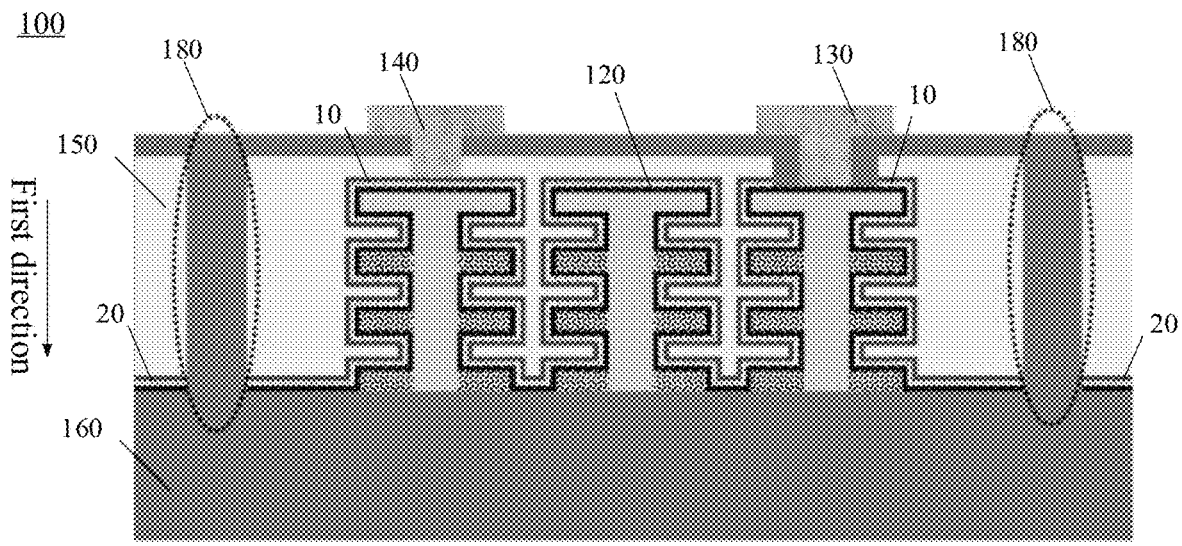
FIG. 14 is a schematic structural diagram of yet another capacitor according to an embodiment of the present disclosure.

For another example, as shown in FIG. 14, the isolation ring 180 extends through the laminated structure 120 along the first direction, thereby isolating the laminated structure 120 into a first region 10 and a second region 20; the first external electrode 130 is only electrically connected to the laminated structure 120 located in the first region 10, and the second external electrode 140 is only electrically connected to the laminated structure 120 located in the first region 10.

Figure 15:
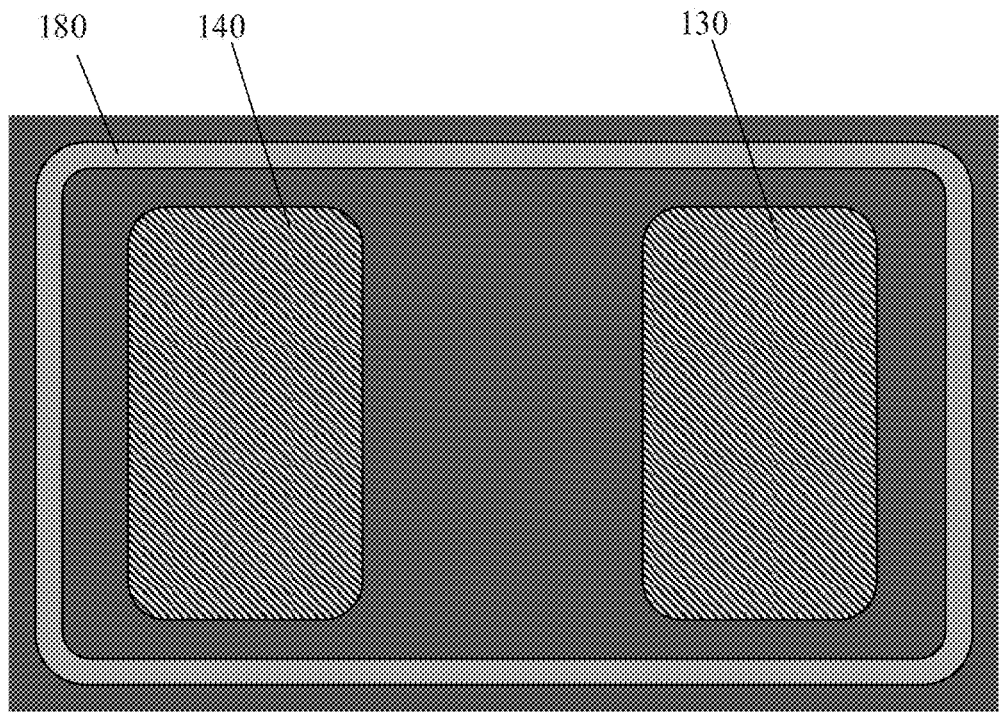
FIG. 15 is a schematic top view of an isolation ring according to an embodiment of the present disclosure.

Specifically, a top view of the isolation ring 180 may be shown in FIG. 15.

It should be noted that at an edge of the capacitor 100 or the capacitor chip, air breakdown easily occurs between the laminated structure 120 and the substrate 160 due to insufficient insulation capacity of air, which leads to a decrease in the performance of the capacitor. With the arrangement of the isolation ring 180, the laminated structure 120 located in the second region 20 does not constitute an electrode plate of the capacitor, thereby avoiding the problem of air breakdown between the laminated structure 120 and the substrate 160 at the edge of the capacitor.

Therefore, in an embodiment of the present disclosure, a multi-wing structure is used as a framework, and a laminated structure is disposed on the multi-wing structure, so that a surface area of the laminated structure may be increased, and a larger capacitance value may be obtained under the condition of a smaller device size, thereby improving capacitance density of the capacitor formed by the laminated structure. Further, in the embodiment of the present disclosure, a laminated structure that a conductive layer and a dielectric layer are alternately stacked is adopted, so that the surface area of the laminated structure may be increased by making fuller use of the multi-wing structure as a framework, thereby further improving the capacitance density of the capacitor.

The capacitor of the embodiment of the present disclosure is described above, and a method for producing a capacitor of an embodiment of the present disclosure will be described below. The method for producing the capacitor of the embodiment of the present disclosure may produce the capacitor of the foregoing embodiments of the present disclosure, and the related descriptions in the following embodiments and the foregoing embodiments may be referred to each other.

Hereinafter, a method for producing a capacitor according to an embodiment of the present disclosure will be introduced in detail with reference to FIG. 16.

Figure 16:
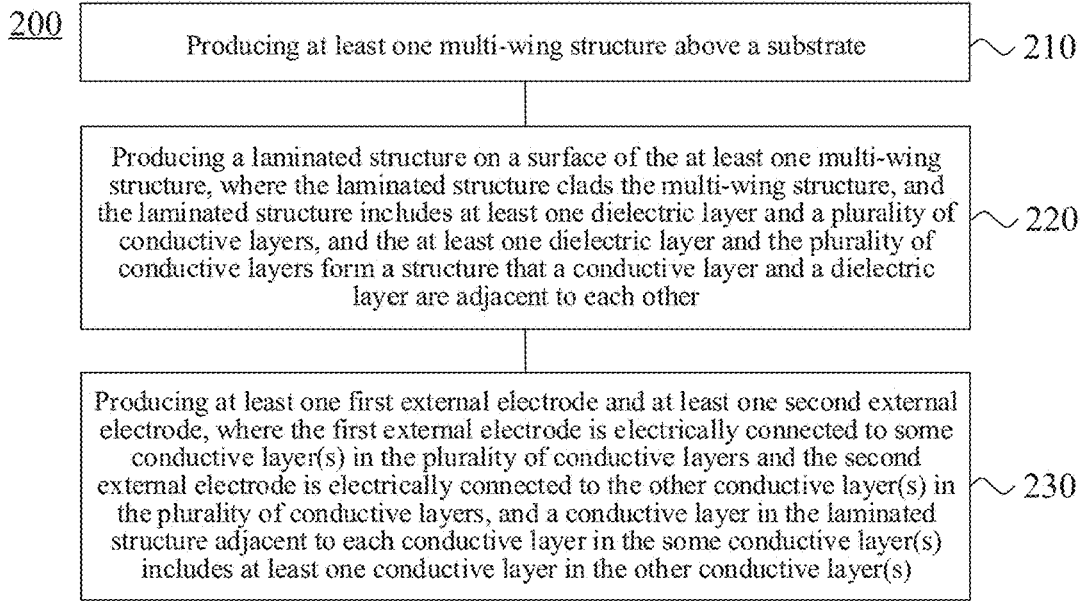
FIG. 16 is a schematic flow chart of a method for producing a capacitor according to an embodiment of the present disclosure.

It should be understood that FIG. 16 is a schematic flow chart of a method for producing a capacitor according to an embodiment of the present disclosure, but these steps or operations are merely examples, and other operations or variations of various operations in FIG. 16 may also be performed in the embodiment of the present disclosure.

FIG. 16 illustrates a schematic flow chart of a method 200 for producing a capacitor according to an embodiment of the present disclosure. As shown in FIG. 16, the method 200 for producing the capacitor includes:

step 210, producing at least one multi-wing structure above a substrate;

step 220, producing a laminated structure on a surface of the at least one multi-wing structure, where the laminated structure clads the multi-wing structure, and the laminated structure includes at least one dielectric layer and a plurality of conductive layers, and the at least one dielectric layer and the plurality of conductive layers form a structure that a conductive layer and a dielectric layer are adjacent to each other; and step 230, producing at least one first external electrode and at least one second external electrode, where the first external electrode is electrically connected to some conductive layer(s) in the plurality of conductive layers and the second external electrode is electrically connected to the other conductive layer(s) in the plurality of conductive layers, and a conductive layer in the laminated structure adjacent to each conductive layer in the some conductive layer(s) includes at least one conductive layer in the other conductive layer(s).

Optionally, the first external electrode 130 is electrically connected to all odd-numbered conductive layer(s) in the plurality of conductive layers, and the second external electrode 140 is electrically connected to all even-numbered conductive layer(s) in the plurality of conductive layers.

Optionally, the multi-wing structure 110 includes N axis (axes) and M wings, where the N axis (axes) extends along a first direction, and the M wings are convex structures formed by extending from a side wall(s) of the N axis (axes) towards a direction perpendicular to the first direction, M is an integer greater than or equal to 2, and N is a positive integer.

Figure 17A:
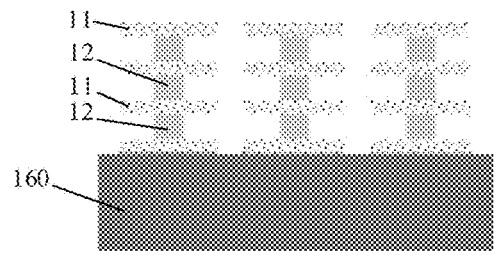
FIGS. 17a to 17s are schematic diagrams of a method for producing a capacitor according to an embodiment of the present disclosure.

Optionally, in the multi-wing structure 110, the M wings are formed of a first material 11, regions connecting the wings in the N axis (axes) are formed of the first material 11, and a region other than the regions connecting the wings in the N axis (axes) is formed of a second material 12 different from the first material 11. For example, when M=4 and N=1, the multi-wing structure 110 is shown in FIG. 17a.

Optionally, the first material or the second material may be silicon (including monocrystalline silicon, polycrystalline silicon, amorphous silicon), silicon oxide, silicon nitride or silicon carbide, silicon-containing glass (including USG, BSG, PSG, BPSG), metals such as aluminum (Al), copper (Cu), nickel (Ni), or metal nitrides, metal carbides, carbon, organic polymers, or a combination or a laminated layer of the foregoing materials.

It should be understood that the second material may be selectively removed relative to the first material. Specifically, in the same corrosion or etching environment, the difference in corrosion (or etching) rates of the first material and the second material is greater than 5 times.

For example, the first material may be silicon, and the second material may be silicon oxide, the silicon oxide may be removed by a hydrofluoric acid solution or gas, and the silicon may be retained.

For another example, the first material may be silicon oxide, and the second material may be silicon. With a KOH, NaOH or TMAH solution, or xenon difluoride ($XeF_2$) gas, the silicon may be removed, and the silicon oxide may be retained.

For another example, the first material may be silicon doped with concentrated boron, and the second material may be silicon with low or no doping concentration. With a KOH, NaOH or TMAH solution, the silicon with low or no doping concentration may be quickly removed, and the silicon doped with concentrated boron may be retained.

Figure 17B:
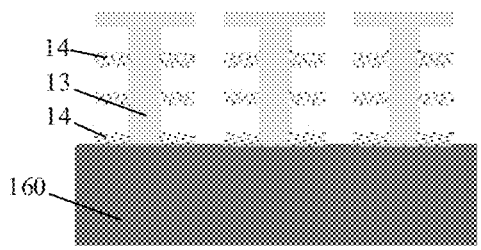

Optionally, as shown in FIG. 17b, in the multi-wing structure 110, a first wing in the M wings and the N axis (axes) are formed of a third material 13, and a wing other than the first wing in the M wings is formed of a fourth material 14 different from the third material 13. For example, when M=4 and N=1, the multi-wing structure 110 is shown in FIG. 17b.

Optionally, the third material or the fourth material may be silicon (including monocrystalline silicon, polycrystalline silicon, amorphous silicon), silicon oxide, silicon nitride or silicon carbide, silicon-containing glass (including USG, BSG, PSG, BPSG), metals such as aluminum (Al), copper (Cu), nickel (Ni), or metal nitrides, metal carbides, carbon, organic polymers, or a combination or a laminated layer of the foregoing materials.

Optionally, the third material and the fourth material may also be the same.

Optionally, the multi-wing structure 110 shown in FIG. 17a may be produced in the following manners:

producing a multi-layer structure above a substrate, where the multi-layer structure includes at least two first material layers and at least one second material layer, and the at least two first material layers and the at least one second material layer form a structure that a first material layer and a second material layer are adjacent to each other, the first material layer is different from the second material layer, and the first material layer is in direct contact with the substrate;

producing at least one first trench on the multi-layer structure, where the first trench extends from an upper surface of the multi-layer structure into the multi-layer structure along a first direction; and removing some second material layer(s) exposed in the first trench to form the at least one multi-wing structure.

Figure 17C:
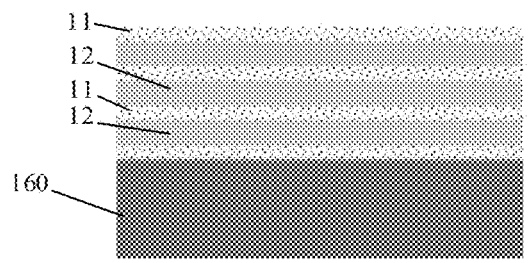

Specifically, first, a first material layer 11, a second material layer 12, a first material layer 11, a second material layer 12, a first material layer 11, a second material layer 12 and a first material layer 11 are sequentially deposited on a substrate 160 by a CVD process to form the multi-layer structure above the substrate 160, as shown in FIG. 17c. For example, the first material layer 11 is made of polysilicon heavily doped with boron, and the second material layer 12 is made of BSG. Specifically, thicknesses of the first material layer 11 and the second material layer 12 may be adjusted according to a capacitance value, a frequency characteristic, a loss and other requirements of the capacitor.

Then, a layer of photoresist is spin-coated on an upper surface of the multi-layer structure as shown in FIG. 17c, after exposure and development, several photoresist notches are opened. The multi-layer structure that is not covered with the photoresist is removed by a dry etching process to form four first trenches 41, and the photoresist is removed as shown in FIG. 17d.

Figure 17D:
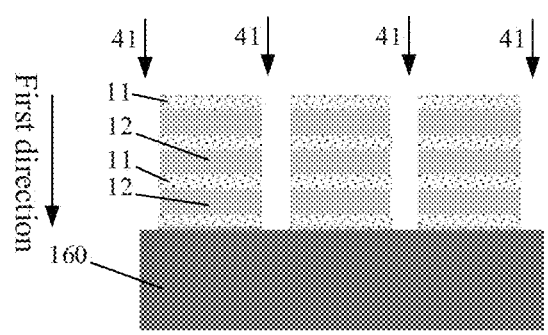
Figure 17E:
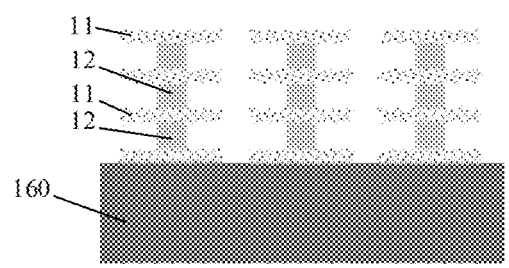

Finally, in the structure shown in FIG. 17d, it is assumed that the second material layer is made of BSG, and the first trench 41 is used as a release hole, a hydrofluoric acid solution or gaseous hydrofluoric acid is introduced into the first trench 41 as a corrosive agent to remove some second material layer(s) (BSG) exposed in the first trench 41 to form three multi-wing structures 110, as shown in FIG. 17e.

Optionally, the multi-wing structure 110 shown in FIG. 17b may be produced in the following manners:

producing a multi-layer structure above a substrate, where the multi-layer structure includes at least one fourth material layer and at least one fifth material layer, and the at least one fourth material layer and the at least one fifth material layer form a structure that a fourth material layer and a fifth material layer are adjacent to each other, the fourth material layer is different from the fifth material layer, and the fourth material layer is in direct contact with the substrate;

producing at least one first trench on the multi-layer structure, where the first trench extends from an upper surface of the multi-layer structure into the multi-layer structure along a first direction; and depositing a third material above the multi-layer structure and in the at least one first trench to form a first structure;

producing at least one second trench on the first structure, where the second trench extends from an upper surface of the first structure into the multi-layer structure along the first direction to expose the at least one fifth material layer, and the second trench is located at an outer side of the first trench; and removing the fifth material layer exposed in the second trench to form the at least one multi-wing structure.

It should be understood that the fifth material layer may be selectively removed relative to the fourth material layer. Specifically, in the same corrosion or etching environment, the difference in corrosion (or etching) rates of the fourth material layer and the fifth material layer is greater than 5 times.

Figure 17F:
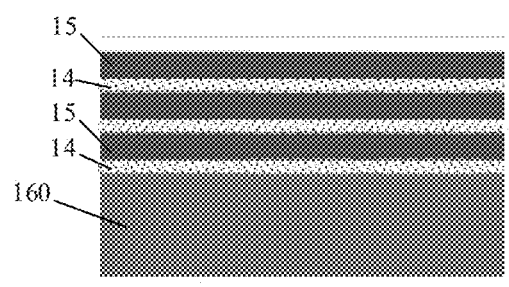

Specifically, first, a fourth material layer 14, a fifth material layer 15, a fourth material layer 14, a fifth material layer 15, a fourth material layer 14 and a fifth material layer 15 are sequentially deposited on a substrate 160 by a CVD process to form the multi-layer structure above the substrate 160, as shown in FIG. 17f. For example, the fourth material layer 14 is made of polysilicon heavily doped with boron, and the fifth material layer 15 is made of BSG. Specifically, thicknesses of the fourth material layer 14 and the fifth material layer 15 may be adjusted according to a capacitance value, a frequency characteristic, a loss and other requirements of the capacitor.

Figure 17G:
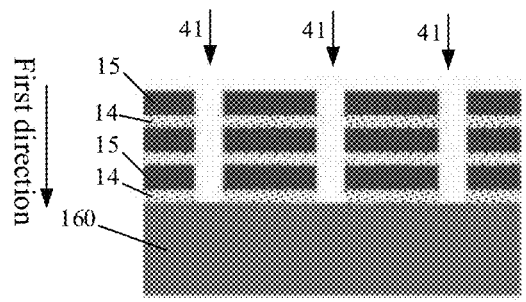

Then, a layer of photoresist is spin-coated on an upper surface of the multi-layer structure as shown in FIG. 17f, after exposure and development, several photoresist notches are opened. The multi-layer structure that is not covered with the photoresist is removed by a dry etching process to form three first trenches 41, and the photoresist is removed as shown in FIG. 17g.

Figure 17H:
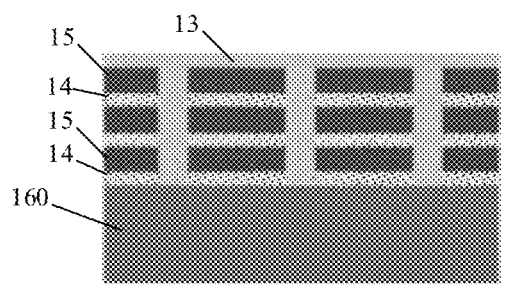

Next, a third material 13 is deposited on an upper surface of the multi-layer structure and an inner surface of the first trench 41 to form a first structure, as shown in FIG. 17h.

Then, in a structure shown in FIG. 17h, a layer of photoresist is spin-coated on an upper surface of the first structure, after exposure and development, several photoresist notches are opened. The first structure that is not covered with photoresist is removed by a dry etching process to form four second trenches 42, and the at least one fifth material layer is exposed in the second trenches 42; and finally, the photoresist is removed, as shown in FIG. 17i.

Figure 17I:
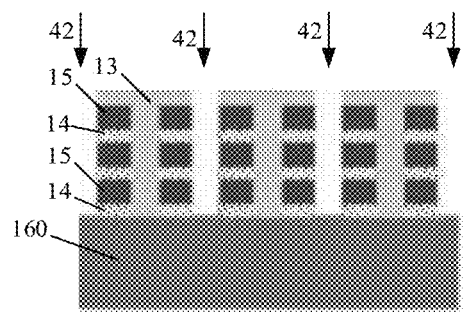
Figure 17J:
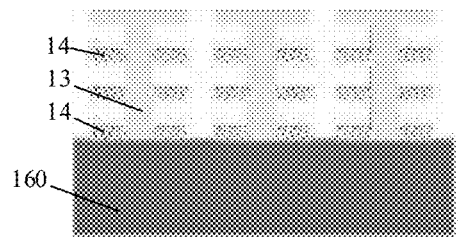

Finally, in a structure shown in FIG. 17i, it is assumed that the fifth material layer is made of BSG, and the second trench 42 is used as a release hole, a hydrofluoric acid solution or gaseous hydrofluoric acid is introduced into the second trench 42 as a corrosive agent to remove all the fifth material layer (BSG) exposed in the second trench 41 to form three multi-wing structures 110, as shown in FIG. 17j.

Optionally, the multi-layer structure may be deposited by various processes such as spin coating, spray coating, thermal oxidation, epitaxy, physical vapor deposition (PVD), chemical vapor deposition (CVD), atomic layer deposition (ALD), epitaxial growth, or the like.

Optionally, the laminated structure 120 may be formed on the substrate 160 by various processes such as thermal oxidation, atomic layer deposition (ALD), chemical vapor deposition (CVD), or the like.

Figure 17K:
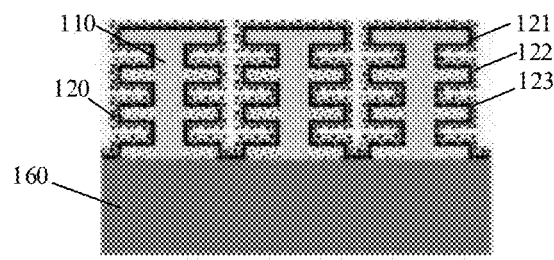

Specifically, the laminated structure 120 may be produced in the following manners:

taking the multi-wing structure 110 shown in FIG. 17b as an example, it is assumed that the laminated structure 120 includes two conductive layers and one dielectric layer, the two conductive layers are denoted as a conductive layer 121 and a conductive layer 122, and the one dielectric layer is denoted as a dielectric layer 123; and the conductive layer 121, the dielectric layer 123 and the conductive layer 122 are sequentially deposited on the multi-wing structure 110 shown in FIG. 17b by an ALD process, as shown in FIG. 17k.

Optionally, the method 200 further includes:

producing a filling structure 150, where the filling structure 150 clads the laminated structure 120 to fill a gap formed by the laminated structure 120.

For example, the filling structure 150 is complementary to the laminated structure 120 in shape.

Figure 17L:
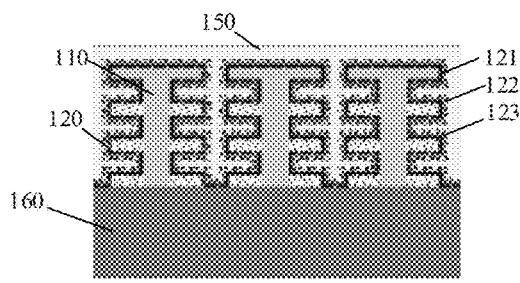

Specifically, in a structure shown in FIG. 17k, a sixth material is filled above the laminated structure 120 by an LPCVD process to form the filling structure 150, as shown in FIG. 17l.

Optionally, the sixth material may be a conductive material or other materials.

Optionally, in some embodiments, the method 200 further includes:

producing an interconnection structure 170, so that the first external electrode 130 and/or the second external electrode 140 is electrically connected to a conductive layer(s) in the plurality of conductive layers through the interconnection structure 170.

Optionally, the interconnection structure 170 includes at least one insulating layer 171 and a conductive channel 172, and the conductive channel 172 penetrates through the at least one insulating layer 171 to electrically connect a conductive layer in the plurality of conductive layers.

Optionally, a deposition method of the at least one insulating layer 171 includes spin coating, spray coating or physical vapor deposition (PVD) or chemical vapor deposition (CVD).

Optionally, a deposition method of the conductive channel 172 includes PVD, metal-organic chemical vapor deposition (MOCVD), or ALD.

Figure 17M:
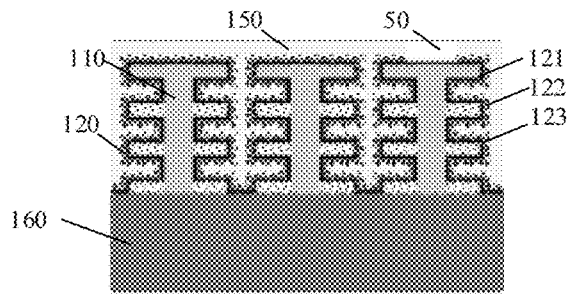
Figure 17N:
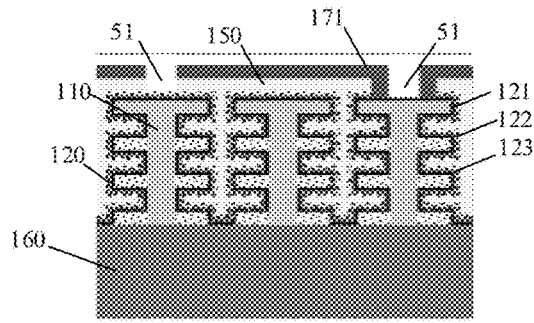
Figure 17O:
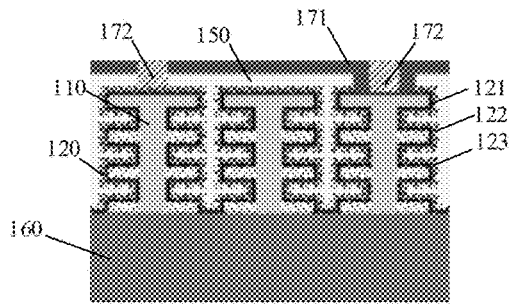

Specifically, in a structure shown in FIG. 17l, photolithography processing is performed on the filling structure 150 to form at least one window structure 50 and expose the conductive layer 121 in the laminated structure 120, as shown in FIG. 17m; an insulating material is deposited on the upper surface of the filling structure 150 and in the at least one window structure 50 to form an insulating layer 171, and photolithography processing is performed on the insulating layer 171 to form two via structures 51, and expose the conductive layer 121 and the conductive layer 122 respectively, as shown in FIG. 17n; and a conductive material is deposited in the via structure 51 to form a conductive channel 172, thereby forming the interconnection structure, as shown in FIG. 17o.

Optionally, in some embodiments, an electrode layer may be produced above the laminated structure 120, and the electrode layer includes at least one first conductive region and at least one second conductive region separated from each other, the first conductive region forms the first external electrode 130, and the second conductive region forms the second external electrode 140.

Optionally, a deposition method of the electrode layer includes PVD, electroplating and chemical plating.

Specifically, in the structure shown in FIG. 17o, the electrode layer is deposited on an upper surface of the interconnection structure, and photolithography processing is performed on the electrode layer to obtain at least one first conductive region and at least one second conductive region separated from each other, the first conductive region forms the first external electrode 130, and the second conductive region forms the second external electrode 140, thereby producing the capacitor 100 shown in FIG. 1.

Optionally, in some embodiments, the multi-wing structure 110 extends from an upper surface of the substrate 160 into the substrate 160 along a first direction. For example, an axis in the multi-wing structure 110 extends into the substrate 160 along the first direction, so that the capacitor shown in FIG. 9 may be produced.

In some possible implementations, the laminated structure 120 extends from an upper surface of the substrate 160 into the substrate 160 along a first direction. For example, the conductive layer 121, the conductive layer 122 and the dielectric layer 123 in the laminated structure 120 extend from the upper surface of the substrate 160 into the substrate 160 along the first direction, and the filling structure 150 also extends into the substrate 160, so that the capacitor shown in FIG. 10 may be produced.

Optionally, in some embodiments, the substrate 160 is a low-resistivity substrate, and the foregoing step 230 specifically includes: producing the at least one first external electrode 130 under the substrate 160, and producing the at least one second external electrode 140 above the multi-wing structure.

Specifically, in the structure shown in FIG. 17l, an electrode material is deposited on a lower surface of the substrate 160 to form the first external electrode 130, and an electrode material is deposited on an upper surface of the filling structure 150 to form the second external electrode 140, thereby producing the capacitor shown in FIG. 11 or FIG. 12.

Optionally, a deposition method of the first external electrode 130 and the second external electrode 140 includes PVD, electroplating and chemical plating.

Optionally, in some embodiments, the plurality of conductive layers includes a first conductive layer, and the first conductive layer is complementary to the multi-wing structure 110 in shape. A conductive layer and a dielectric layer in the laminated structure 120 other than the first conductive layer are conformal to the multi-wing structure 110. Therefore, the capacitor shown in FIG. 8 may be produced based on the foregoing steps 210 to 230.

Optionally, in some embodiments, the multi-wing structure 110 is formed of a material with a resistivity less than a threshold value, or a surface of the multi-wing structure 110 is provided with a heavily doped conductive layer with a resistivity less than the threshold value.

For example, a conductive layer closest to the multi-wing structure 110 in the laminated structure 120 is electrically connected to the first external electrode 130, and the multi-wing structure 110 is electrically connected to the second external electrode 140.

For another example, a conductive layer closest to the multi-wing structure 110 in the laminated structure 120 is electrically connected to the second external electrode 140, and the multi-wing structure 110 is electrically connected to the first external electrode 130.

In some possible implementations, the method further includes:

producing an isolation ring 180, where the isolation ring 180 is located at an outer side of the at least one multi-wing structure 110, and the isolation ring is disposed in the laminated structure 120 and extends from an upper surface of the laminated structure 120 into or through the laminated structure 120 along a first direction to isolate the laminated structure 120 into a first region 10 and a second region 20, and the first external electrode 130 and/or the second external electrode 140 is only electrically connected to the laminated structure 120 located in the first region 10.

Figure 17P:
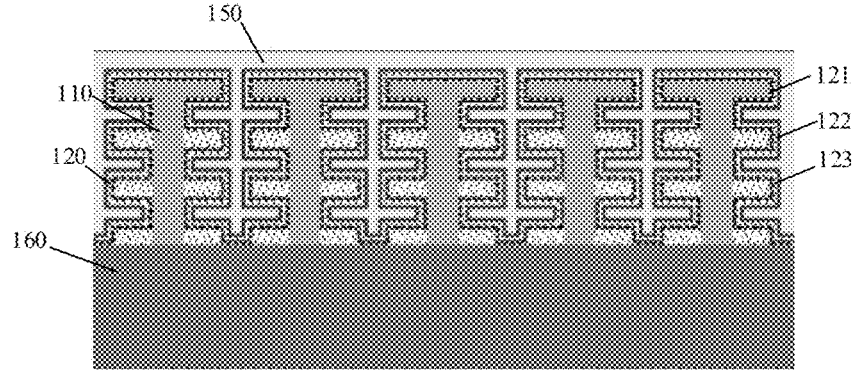
Figure 17Q:
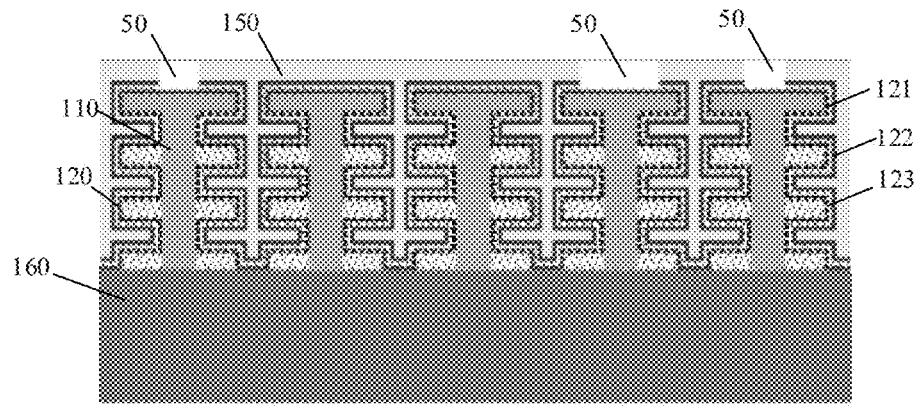
Figure 17R:
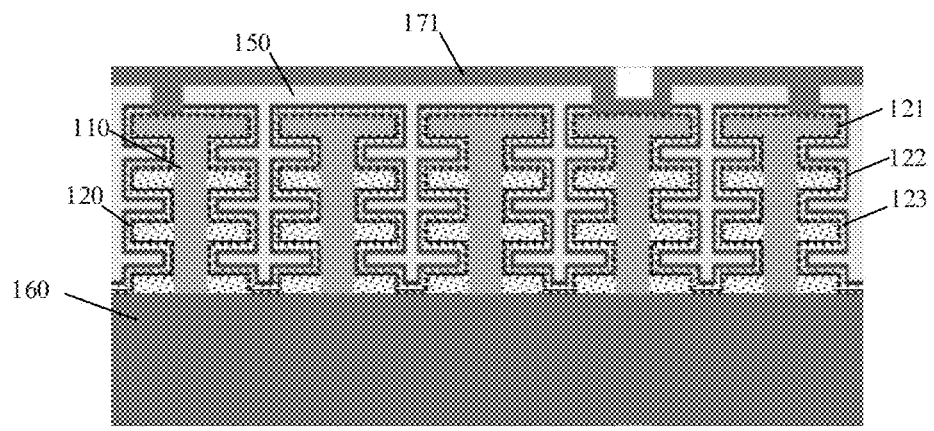
Figure 17S:
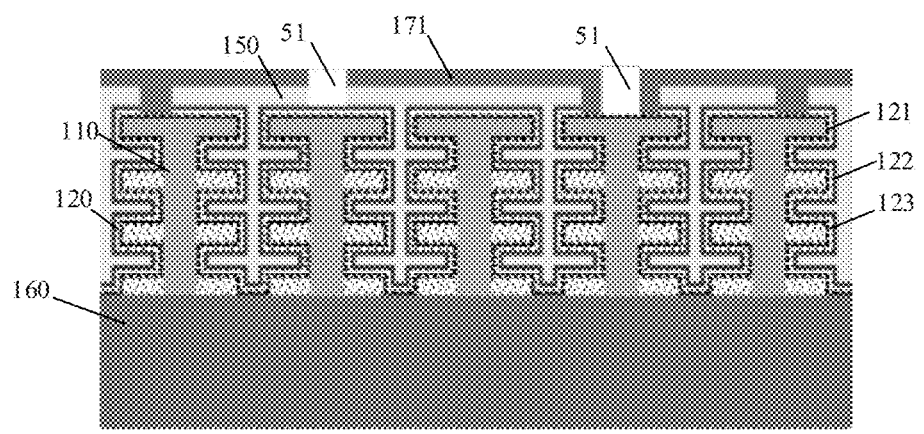

Specifically, in the step 220, the structure shown in FIG. 17p may be produced, and then photolithography processing is performed on the filling structure 150 to form a window structure 50 and the conductive layer 121 in the laminated structure 120 is exposed, as shown in FIG. 17q. Next, an insulating material is deposited on the upper surface of the filling structure 150 and in the at least one window structure 50, to form the insulating layer 171 in the interconnection structure 170 and the isolation ring 180, as shown in FIG. 17r. Then, photolithography processing is performed on the insulating layer 171 to form two via structures 51 to expose the conductive layer 121 and the conductive layer 122 in the laminated structure 120, respectively, as shown in FIG. 17s. Then, an electrode material is deposited on an upper surface of the insulating layer 171 and in the via structure 51, and photolithography processing is performed to produce the capacitor as shown in FIG. 13.

It should be noted that, the isolation ring 180 extends into the laminated structure 120 located at an edge of a capacitor chip along the first direction, thereby isolating the laminated structure 120 into a first region 10 and a second region 20, and the second external electrode 140 is only electrically connected to the laminated structure 120 located in the first region 10.

Specifically, in the structure shown in FIG. 17l, photolithography processing is performed on the filling structure 150 to form a window structure 50 in which the conductive layer 121 in the laminated structure 120 is exposed and an annular trench 60 in which the substrate 160 is exposed. Then, an insulating material is deposited on the upper surface of the filling structure 150, in the at least one window structure 50 and in the annular trench 60 to form the insulating layer 171 in the interconnection structure 170 and the isolation ring 180. Next, photolithography processing is performed on the insulating layer 171 to form two via structures 51 to expose the conductive layer 121 and the conductive layer 122 in the laminated structure 120, respectively. Then, an electrode material is deposited on the upper surface of the insulating layer 171 and in the via structure 51, and photolithography processing is performed to produce the capacitor as shown in FIG. 14.

Therefore, in the method for producing the capacitor provided by the embodiment of the present disclosure, the capacitance value of the capacitor may be increased by the manner of producing the multi-wing structure.

A method for producing a capacitor according to the present disclosure is further described below in conjunction with two specific embodiments. For ease of understanding, a capacitor as shown in FIG. 1 is produced in embodiment I. A capacitor as shown in FIG. 7 is produced in embodiment II. Of course, capacitors shown in FIG. 8, FIG. 9, FIG. 10, FIG. 11, FIG. 12, FIG. 13 and FIG. 14 may also be produced by using the method for producing the capacitor in the embodiment I and embodiment II, except that the arrangements of the electrode layer, the substrate, the multi-wing structure, the laminated structure and the insolation ring are different, which will not be repeatedly described here for brevity.

Embodiment I

Step 1: a silicon wafer is selected as a substrate. A laminated structure made of a structural material 1-a sacrificial material-a structural material 1-a sacrificial material-a structural material 1-a sacrificial material is deposited on the substrate by a CVD process. The structural material 1 is polysilicon heavily doped with boron, and the sacrificial material is BSG.

Step 2: a layer of photoresist is spin-coated on a surface of the laminated structure, after exposure and development, a plurality of photoresist notches are opened, and then a film structure that is not covered with the photoresist is removed by a dry etching process to form a trench 1. Finally, the photoresist is removed.

Step 3: polysilicon heavily doped with boron is filled inside the trench 1 by a CVD process as a structural material 2.

Step 4: a layer of photoresist is spin-coated on a surface of the structural material 2, after exposure and development, a plurality of photoresist notches are opened, and then a film structure that is not covered with the photoresist is removed by a dry etching process to form a trench 2. Finally, the photoresist is removed.

Step 5: the trench 2 is used as a release hole, a hydrofluoric acid solution or gaseous hydrofluoric acid is used as a corrosive agent to remove BSG so as to obtain a multi-wing structure made of polysilicon. It should be noted that since projections of the trench 1 and trench 2 on the substrate surface may be various, there are many possibilities for the three-dimensional shape of the wing-shaped structure.

Step 6: a layer of TiN is deposited on a surface of the multi-wing structure by an ALD process as a first electrode plate of the capacitor; then a layer of alumina is deposited as a dielectric layer; and finally a layer of TiN is deposited as a second electrode plate.

Step 7: by using a low pressure chemical vapor deposition (LPCVD) process, silicon oxide is deposited as a filling material to fill and clad the entire multi-wing structure.

Step 8: a layer of photoresist is spin-coated on a surface of the filling material, after exposure and development, a photoresist notch is opened, and then a second conductive layer and a dielectric layer in the notch are removed by a dry etching process to expose a first conductive layer of the capacitor.

Step 9: a layer of USG is deposited as an insulating material by a PECVD process.

Step 10: a layer of photoresist is spin-coated on a surface of USG, after exposure and development, two photoresist notches are opened, and then USG and silicon oxide in the notches are removed by a hydrofluoric acid solution. The two notches expose the first conductive layer and the second conductive layer, respectively.

Step 11: a layer of Al is deposited by a PVD process. Two pads (electrodes) of Al are formed by photolithography. One pad is connected to the first conductive layer, and the other pad is connected to the second conductive layer.

Embodiment II

Step 1: a silicon wafer is selected as a substrate. A laminated structure made of a structural material-a sacrificial material-a structural material-a sacrificial material-a structural material-a sacrificial material is deposited on the substrate by a CVD process. The structural material is amorphous silicon and the sacrificial material is TEOS.

Step 2: a layer of photoresist is spin-coated on a surface of the laminated structure, after exposure and development a plurality of photoresist notches are opened, and then a film structure that is not covered with the photoresist is removed by a dry etching process to form a trench. Finally, the photoresist is removed.

Step 3: the trench is used as a release hole, a hydrofluoric acid solution or gaseous hydrofluoric acid is used as a corrosive agent of TEOS to keep part of TEOS by controlling a corrosion rate and time to obtain a multi-wing structure shown in the following figure.

Step 4: a layer of TiN is deposited on a surface of the multi-wing structure by an ALD process as a first electrode plate of the capacitor; a layer of alumina is deposited as a first dielectric layer; a layer of TiN is deposited as a second electrode plate; a layer of alumina is deposited as a second dielectric layer; and finally, by using an LPCVD process, the remaining gap is filled up with heavily doped polysilicon as a third electrode plate.

Step 5: two notches are opened by a two-step photolithography process to expose the first electrode plate and the second electrode plate, respectively, as shown in the figure.

Step 6: by using a plasma enhanced chemical vapor deposition (PECVD) process, a layer of silicon oxide is deposited as an interlayer dielectric layer.

Step 7: a plurality of vias are opened by a photolithography process to expose the first electrode plate, the second electrode plate and the third electrode plate respectively.

Step 8: by using a PVD process, a layer of Ti is deposited in the via as an adhesion layer and a layer of TiN is used as a barrier layer; and then, by using an MOCVD process, the via is filled up with tungsten to form a conductive channel. Finally, the excess metal on the surface is grinded by a surface planarization process.

Step 9: a layer of Ti, a layer of TiN and a layer of Al are deposited by a PVD process; and finally, two pads are formed by photolithography. One pad is connected to the first electrode plate and the third electrode plate through the conductive channel, and the other pad is connected to the second electrode plate through the conductive channel.

A person skilled in the art may understand that the preferred embodiments of the present disclosure are described in detail above with reference to the accompanying drawings. However, the present disclosure is not limited to specific details in the foregoing embodiments. Within the technical concept of the present disclosure, the technical solution of the present disclosure may carry out a variety of simple variants, all of which are within the scope of protection of the present disclosure.

In addition, it should be noted that various specific technical features described in the foregoing specific embodiments may be combined in any suitable manner under the condition of no contradiction. In order to avoid unnecessary repetition, various possible combination ways will not be separately described in the present disclosure.

In addition, any combination may be made between various embodiments of the present disclosure without departing from the idea of the present disclosure, it should also be regarded as the disclosure of the present disclosure.

What is claimed is:

1. A capacitor, comprising:
    at least one multi-wing structure;
    a substrate disposed under the multi-wing structure, the laminated structure extends from an upper surface of the substrate into the substrate along a first direction, and the first direction is a direction perpendicular to the substrate;
    a laminated structure cladding the at least one multi-wing structure, wherein the laminated structure comprises two conductive layers and a dielectric layer laminated between the two conductive layers;
    a first external electrode, wherein the first external electrode is electrically connected to one of the two conductive layers;
    a second external electrode, wherein the second external electrode is electrically connected to the other conductive layer of the two conductive layers; and
    wherein the first external electrode and the second external electrode are disposed above the multi-wing structure, the first external electrode and the second external electrode are electrically connected to the two conductive layers respectively through an interconnection structure, the interconnection structure comprises at least one insulating layer and two conductive channels, and the first external electrode and the second external electrode are electrically connected to the two conductive layers respectively through the two conductive channels.

2. The capacitor according to claim 1, wherein the laminated structure further comprises another multiple conductive layers and at least another dielectric layer, the first external electrode is electrically connected to all odd-numbered conductive layers of all the conductive layers, and the second external electrode is electrically connected to all even-numbered conductive layers of all the conductive layers.

3. The capacitor according to claim 1, wherein the two conductive layers and the dielectric layer of the laminated structure are conformal to the multi-wing structure.

4. The capacitor according to claim 1, wherein the capacitor further comprises a filling structure, and the filling structure dads the laminated structure to fill a gap formed by the laminated structure.

5. The capacitor according to claim 4, wherein the filling structure is complementary to the laminated structure in shape.

6. The capacitor according to claim 1, wherein:
    a conductive layer of the two conductive layers closest to the multi-wing structure is electrically connected to the first external electrode, and the multi-wing structure is electrically connected to the second external electrode; or
    a conductive layer of the two conductive layers closest to the multi-wing structure is electrically connected to the second external electrode, and the multi-wing structure is electrically connected to the first external electrode.

7. The capacitor according to claim 1, wherein the multi-wing structure comprises N axes and M wings, and the N axes extends along a first direction, and the M wings are convex structures formed by extending from side walls of the N axes towards a direction perpendicular to the first direction, M is an integer greater than or equal to 2, and N is a positive integer.

8. The capacitor according to claim 7, wherein the M wings are formed of a first material, regions in the N axes for connecting the wings are formed of the first material, and regions other than the regions connecting the wings are formed of a second material different from the first material.

9. The capacitor according to claim 7, wherein a first wing in the M wings and the N axes are formed of a third material, and a wing other than the first wing in the M wings is formed of a fourth material different from the third material.

10. The capacitor according to claim 9, wherein the first wing is located above the remaining wings of the M wings.

11. The capacitor according to claim 1, wherein the capacitor further comprises:
    an isolation ring located at an outer side of the at least one multi-wing structure, wherein the isolation ring is disposed in the laminated structure and extends from an upper surface of the laminated structure into or through the laminated structure along the first direction to isolate the laminated structure into a first region and a second region surrounding the first region, and the first external electrode and/or the second external electrode is only electrically connected to the laminated structure located in the first region.

12. The capacitor according to claim 1, wherein the multi-wing structure extends from an upper surface of the substrate into the substrate along a first direction.

13. The capacitor according to claim 1, wherein any one of the conductive layers comprise at least one of following layers:
a heavily doped polysilicon layer, a metal silicide layer, a carbon layer, a conductive polymer layer, an aluminum layer, a copper layer, a nickel layer, a tantalum nitride layer, a titanium nitride layer, an aluminum titanium nitride layer, a tantalum silicon nitride layer, or a tantalum carbon nitride layer; and the dielectric layer comprises at least one of following layers;
a silicon oxide layer, a silicon nitride layer, a silicon oxynitride layer, a metal oxide layer, a metal nitride layer, or a metal oxynitride layer.

14. A method for producing a capacitor, comprising:
producing at least one multi-wing structure above a substrate, the laminated structure extends from an upper surface of the substrate into the substrate along a first direction, and the first direction is a direction perpendicular to the substrate;
producing a laminated structure on a surface of the at least one multi-wing structure, wherein the laminated structure dads the multi-wing structure and comprises at least one dielectric layer and a plurality of conductive layers, and the at least one dielectric layer and the plurality of conductive layers form a structure that a conductive layer and a dielectric layer are adjacent to each other;
producing at least one first external electrode and at least one second external electrode, wherein the first external electrode is electrically connected to one or some conductive layers in the plurality of conductive layers and the second external electrode is electrically connected to the other conductive layers in the plurality of conductive layers; and
wherein the first external electrode and the second external electrode are disposed above the multi-wing structure, the first external electrode and the second external electrode are electrically connected to the two conductive layers respectively through an interconnection structure, the interconnection structure comprises at least one insulating layer and two conductive channels, and the first external electrode and the second external electrode are electrically connected to the two conductive layers respectively through the two conductive channels.

15. The method according to claim 14, wherein the producing the at least one multi-wing structure above the substrate comprises:
producing a multi-layer structure above the substrate, wherein the multi-layer structure comprises at least two first material layers made of first material and at least one second material layer made of second material, and the at least two first material layers and the at least one second material layer form a structure that a first material layer and a second material layer are adjacent to each other, the first material is different from the second material, and the first material layer is in direct contact with the substrate;
producing at least one first trench on the multi-layer structure, wherein the first trench extends from an upper surface of the multi-layer structure into the multi-layer structure along a first direction; and
removing part of each second material layer exposed in the first trench to form the at least one multi-wing structure.

16. The capacitor according to claim 1, wherein the capacitor further comprises: an electrode layer disposed above the multi-wing structure, the electrode layer comprises at least one first conductive region and at least one second conductive region separated from each other, the first conductive region forms the first external electrode, and the second conductive region forms the second external electrode.

* * * * *